US009571098B2

(12) United States Patent
Kim et al.

(10) Patent No.: US 9,571,098 B2
(45) Date of Patent: Feb. 14, 2017

(54) SIGNAL RECEIVING CIRCUITS INCLUDING TERMINATION RESISTANCE HAVING ADJUSTABLE RESISTANCE VALUE, OPERATING METHODS THEREOF, AND STORAGE DEVICES THEREWITH

(71) Applicants: Sung-Ha Kim, Yongin-si (KR); Hwaseok Oh, Yongin-si (KR)

(72) Inventors: Sung-Ha Kim, Yongin-si (KR); Hwaseok Oh, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/822,074

(22) Filed: Aug. 10, 2015

(65) Prior Publication Data

US 2016/0043761 A1 Feb. 11, 2016

Related U.S. Application Data

(60) Provisional application No. 62/035,570, filed on Aug. 11, 2014.

(30) Foreign Application Priority Data

Oct. 10, 2014 (KR) .................. 10-2014-0136833

(51) Int. Cl.
*H03K 19/00* (2006.01)
*H04B 1/04* (2006.01)

(52) U.S. Cl.
CPC ........ *H03K 19/0005* (2013.01); *H04B 1/0475* (2013.01); *H04B 1/0483* (2013.01); *H04B 2001/0441* (2013.01)

(58) Field of Classification Search
CPC ............ H04L 25/0278; H04L 25/0298; H04L 25/03885; H03K 19/0005; H03K 19/0008; H03K 19/017545; H04B 1/0475; H04B 1/0483; H04B 2001/0441
See application file for complete search history.

(56) References Cited

U.S. PATENT DOCUMENTS

| 7,034,565 | B2 | 4/2006 | Lee |
| 7,154,295 | B2 | 12/2006 | Choe |
| 7,161,378 | B2 * | 1/2007 | Kang .................. H04L 25/0284 326/26 |
| 7,193,431 | B2 | 3/2007 | Miyake et al. |
| 7,342,412 | B2 | 3/2008 | Kim |

(Continued)

FOREIGN PATENT DOCUMENTS

JP 2013211600 A 10/2013

*Primary Examiner* — Vineeta Panwalkar
(74) *Attorney, Agent, or Firm* — Harness, Dickey & Pierce

(57) ABSTRACT

A receiving circuit includes a termination resistance circuit and a resistance adjustment circuit. The termination resistance circuit is configured to receive a first differential signal via a first input terminal and a second differential signal via a second input terminal, and to be selectively connected to the first and second input terminals. The termination resistance circuit has an adjustable resistance value. The resistance adjustment circuit is configured to decrease the resistance value of the termination resistance circuit in response to a signal reception preparation command and connection of the termination resistance circuit to the first and second input terminals.

19 Claims, 14 Drawing Sheets

(56) References Cited

U.S. PATENT DOCUMENTS

| | | | |
|---|---|---|---|
| 7,825,683 B2 | 11/2010 | Kim et al. | |
| 7,888,963 B2 | 2/2011 | Lee | |
| 8,238,180 B2 | 8/2012 | Jung | |
| 2008/0278280 A1* | 11/2008 | Alexeyev | H03F 3/45183 340/2.29 |
| 2010/0066404 A1* | 3/2010 | Zhang | H03K 19/0005 326/30 |
| 2011/0280322 A1* | 11/2011 | Suenaga | H04L 25/0278 375/257 |
| 2013/0307584 A1 | 11/2013 | Oh et al. | |
| 2014/0375416 A1* | 12/2014 | Tsuchida | H04L 25/4902 338/20 |

* cited by examiner

SIGNAL RECEIVING CIRCUITS INCLUDING TERMINATION RESISTANCE HAVING ADJUSTABLE RESISTANCE VALUE, OPERATING METHODS THEREOF, AND STORAGE DEVICES THEREWITH

CROSS-REFERENCE TO RELATED APPLICATIONS

The present application claims priority under 35 U.S.C. §119 to U.S. Provisional Application No. 62/035,570 filed on Aug. 11, 2014, and Korean Patent Application No. 10-2014-0136833 filed on Oct. 10, 2014, the entire contents of each of which are incorporated herein by reference.

BACKGROUND

Field

One or more example embodiments described herein relate to interfacing, for example, signal receiving circuits, storage devices, and/or methods of controlling signal receiving circuits of electronic devices for interfacing between electronic devices.

Description of the Related Art

Nowadays, various types of electronic devices are being used. An electronic device can independently perform its own functions. In addition, an electronic device can exchange data with another electronic device to perform its own function. Interfacing is used to exchange data between two (or more) electronic devices. Different types of electronic devices utilize various types of interface protocols.

For instance, the mobile industry processor interface (MIPI) alliance has proposed the interface protocol in which "UniPro" is used as a link layer to standardize an interface process of a mobile device. UniPro supports a physical layer that is referred to as "PHY". A physical layer of an interface circuit, such as PHY, includes a transmitter and a receiver for exchanging signals with another interface circuit.

A receiver receives a signal from a transmitter, and includes a termination resistance for suppressing and/or preventing the received signal from being distorted. According to some interface protocols, the termination resistance is disconnected to reduce power consumption when no signal is transmitted. The termination resistance is connected when transmission of a signal begins to improve received signal quality.

However, when the termination resistance is disconnected and then connected at a particular time, current suddenly begins to flow through the connected termination resistance. The transmitter is influenced by this sudden current flow. In one example, a regulation voltage used to generate an output signal of the transmitter may fluctuate due to the sudden current flow, which may cause noise in the output signal of the transmitter resulting in an error upon interfacing.

SUMMARY

At least one example embodiment provides a receiving circuit configured to receive a differential signal. The receiving circuit includes: first and second transmission routes; a termination resistance circuit; a switching circuit; and a resistance adjustment circuit. The first and second transmission routes are configured to transmit the received differential signal. The termination resistance circuit is connected between the first transmission route and the second transmission route, and has a resistance value that is adjustable between a first resistance value and a second resistance value, which is less than the first resistance value. The switching circuit is configured to control a connection between the first and second transmission routes and the termination resistance circuit. The resistance adjustment circuit is configured to adjust the resistance value of the termination resistance circuit (e.g., stepwise or gradually) from the first resistance value to the second resistance value, when the termination resistance circuit is disconnected from at least one of the first and second transmission routes, and then connected to the first and second transmission routes according to a control of the switching circuit.

At least one other example embodiment provides an operating method for a receiving circuit configured to receive a differential signal. The operating method includes: receiving a signal reception preparation command through first and second transmission routes configured to transmit the differential signal; connecting a termination resistance circuit between the first transmission route and the second transmission route in response to receiving the signal reception preparation command, a resistance value of the termination resistance circuit being adjustable between a first resistance value and a second resistance value, which is less than the first resistance value; adjusting the resistance value of the termination resistance circuit from the first resistance value to the second resistance value in response to connecting the termination resistance circuit to the first and second transmission routes; and receiving the differential signal through the first and second transmission routes when the resistance value of the termination resistance circuit is set to the second resistance value and a signal reception preparation state initiated in response to the signal reception preparation command ends.

At least one other example embodiment provides a storage device including a memory controller, an interface circuit, and a nonvolatile memory. The interface circuit may be configured to receive a differential signal from a host in compliance with an interface protocol using a physical layer. The nonvolatile memory may be configured to store data corresponding to the received differential signal according to a control of the memory controller. The interface circuit may include one or more receiving circuits which are included in the physical layer. Each of the one or more receiving circuits may include first and second transmission routes, a termination resistance circuit, a switching circuit, and a resistance adjustment circuit. The first and second transmission routes are configured to transmit the received differential signal. The termination resistance circuit may be connected between the first transmission route and the second transmission route, and may have a resistance value which is adjustable between a first resistance value and a second resistance value, which is less than the first resistance value. The switching circuit is configured to control a connection between the first and second transmission routes and the termination resistance circuit. The resistance adjustment circuit may be configured to adjust the resistance value of the termination resistance circuit from the first resistance value to the second resistance value, when the termination resistance circuit is disconnected from at least one of the first and second transmission routes and then connected to the first and second transmission routes according to a control of the switching circuit.

At least one other example embodiment provides a receiving circuit configured to receive a differential signal. The receiving circuit includes: a termination resistance circuit connected between a first input terminal and a second input terminal, the termination resistance circuit having a resistance value that is adjustable between a first resistance value and a second resistance value, the second resistance value being less than the first resistance value; a switching circuit configured to control a connection between the termination resistance circuit and each of the first and second input terminals; and a resistance adjustment circuit configured to adjust the resistance value of the termination resistance circuit from the first resistance value to the second resistance value when the termination resistance circuit is disconnected from at least one of the first and second input terminals, and then connected to the first and second input terminals by the switching circuit.

At least one other example embodiment provides a method of operating a receiving circuit. According to at least this example embodiment, the method includes: receiving a signal reception preparation command through first and second input terminals; connecting a termination resistance circuit between the first input terminal and the second input terminal in response to receiving the signal reception preparation command; adjusting the resistance value of the termination resistance circuit from a first resistance value to a second resistance value in response to the connecting of the termination resistance circuit to the first and second input terminals, the second resistance value being less than the first resistance value; and receiving a differential signal through the first and second input terminals when the resistance value of the termination resistance circuit is set to the second resistance value and a signal reception preparation state initiated in response to the signal reception preparation command.

At least one other example embodiment provides a storage device including: a memory controller; an interface circuit configured to receive a differential signal from a host in accordance with an interface protocol using a physical layer; and a nonvolatile memory configured to store data corresponding to the received differential signal according to a control of the memory controller. The interface circuit includes one or more receiving circuits at the physical layer, and at least one of the one or more receiving circuits includes: a termination resistance circuit connected between a first input terminal and a second input terminal, the termination resistance circuit having a resistance value that is adjustable between a first resistance value and a second resistance value, the second resistance value being less than the first resistance value; a switching circuit configured to control a connection between the termination resistance circuit and each of the first and second input terminals; and a resistance adjustment circuit configured to adjust the resistance value of the termination resistance circuit from the first resistance value to the second resistance value when the termination resistance circuit is disconnected from at least one of the first and second input terminals, and then connected to the first and second input terminals by the switching circuit.

At least one other example embodiment provides a receiving circuit including: a termination resistance circuit having an adjustable resistance value, the termination resistance circuit being configured to receive a differential signal via a first input terminal and a second input terminal, the termination resistance circuit being further configured to be selectively connected to the first and second input terminals; and a resistance adjustment circuit configured to decrease the adjustable resistance value of the termination resistance circuit in response to a signal reception preparation command and connection of the termination resistance circuit to the first and second input terminals.

At least one other example embodiment provides a storage device including: an interface circuit configured to receive differential signals from a host, the interface circuit including at least one receiving circuit at a physical layer; a nonvolatile memory configured to store data corresponding to the received differential signals; and a memory controller configured to control the memory controller. The receiving circuit includes: a termination resistance circuit having an adjustable resistance value, the termination resistance circuit being configured to receive a differential signal via a first input terminal and a second input terminal, the termination resistance circuit being further configured to be selectively connected to the first and second input terminals; and a resistance adjustment circuit configured to decrease the adjustable resistance value of the termination resistance circuit in response to a signal reception preparation command and connection of the termination resistance circuit to the first and second input terminals.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Figure 1:
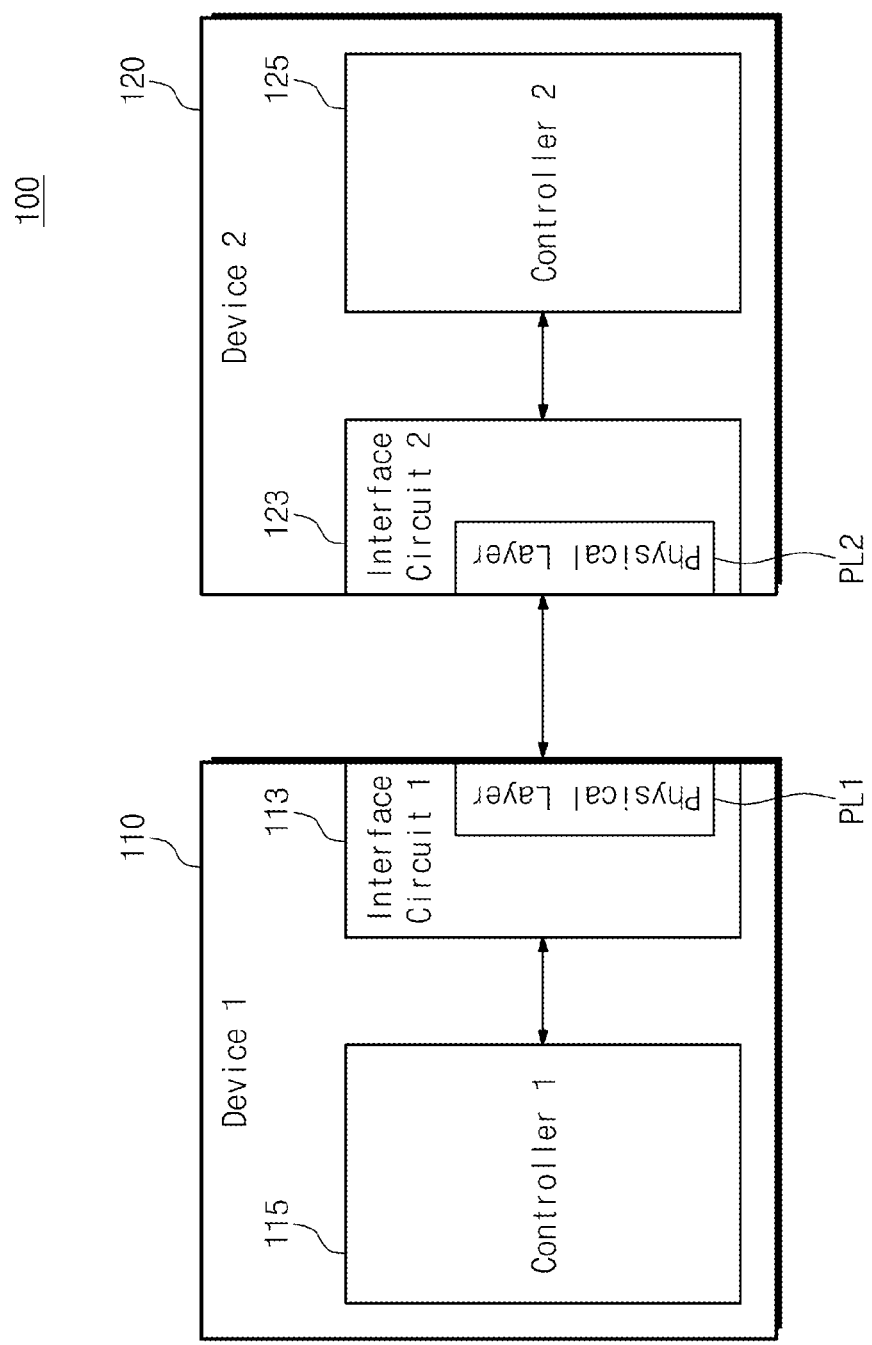
FIG. 1 is a block diagram illustrating an example embodiment of an electronic system including two electronic devices, which are connected to each other.

Example embodiments will be described in detail with reference to the accompanying drawings. Example embodiments, however, may be embodied in various different forms, and should not be construed as being limited only to the illustrated embodiments. Rather, these embodiments are provided as examples so that this disclosure will be thorough and complete, and will fully convey inventive concepts to those skilled in the art. Accordingly, known processes, elements, and techniques are not described with respect to some of the example embodiments of the present invention. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present application.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As discussed herein, one or more example embodiments (or components thereof) may be implemented as hardware, firmware, hardware executing software or any combination thereof. When one or more example embodiments are implemented as hardware, such hardware may include one or more processing or processor circuits, Central Processing circuits (CPUs), system-on-chips (SOCs), digital signal processors (DSPs), application-specific-integrated-circuits (ASICs), field programmable gate arrays (FPGAs) computers or the like configured as special purpose machines to perform the functions of one or more example embodiments. CPUs, SOCs, DSPs, ASICs and FPGAs may sometimes generally be referred to as processors and/or microprocessors.

Further, although one or more example embodiments may be described herein as "blocks", it should be understood that the components described as "blocks" may also be referred to as "circuits". Moreover, the components described as blocks may be implemented as hardware, firmware, hardware executing software or any combination thereof.

Although a flow chart may describe operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium," may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, processor(s), processing circuit(s), or processing unit(s) may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

FIG. 1 is a block diagram illustrating an example embodiment of an electronic system including two electronic devices connected to each other.

Referring to FIG. 1, an electronic system 100 may include a first electronic device 110 and a second electronic device 120. The first electronic device 110 may include a first interface circuit 113 and a first controller 115. The second electronic device 120 may include a second interface circuit 123 and a second controller 125. However, each of the first electronic device 110 and the second electronic device 120 may further include other components not shown in FIG. 1. The configuration illustrated in FIG. 1 is an example to help understanding of example embodiments discussed herein.

As an example, the first electronic device 110 may be a host. For instance, when the electronic system 100 is a mobile electronic system, the first electronic device 110 may include an application processor. As another example, the second electronic device 120 may be a storage device. However, example embodiments are not limited to the above-described examples. In one or more other example embodiments, function and configuration of the first electronic device 110 and function and configuration of the second electronic device 120 may be exchanged. In addition, the first electronic device 110 and the second electronic device 120 may be different types of electronic devices. For instance, each of the first electronic device 110 and the second electronic device 120 may be a display device, an image processor, a radio frequency (RF) communication chip, or the like. However, example embodiments are not limited to these examples.

The first electronic device 110 may be connected to the second electronic device 120 through the first interface circuit 113. The first electronic device 110 may exchange signals and/or data with the second electronic device 120 through the first interface circuit 113. For example, the first electronic device 110 may exchange differential signals with the second electronic device 120.

The first interface circuit 113 may include a first physical layer PL1. The first physical layer PL1 may include physical components for exchanging data with the second electronic device 120. In one example, the first physical layer PL1 may include one or more transmitting circuits and one or more receiving circuits for exchanging data with the second electronic device 120.

When the electronic system 100 is a mobile electronic system, for example, the first physical layer PL1 may be defined by the "M-PHY" specification. M-PHY is an interface protocol proposed by the mobile industry processor interface (MIPI) alliance. In this example, the first interface circuit 113 may further include a link layer (not shown) that manages data composition, integrity, and error. Further, the link layer of the first interface circuit 113 may include a physical adapted layer (not shown). The physical adapted layer may control the first physical layer PL1 (e.g., managing symbols of data, managing power, etc.).

Example embodiments are not limited to the above-described examples. As will be described later, example embodiments may be applied to any interface circuits that include a physical layer. The above-described example embodiments are provided to help understanding of inventive concepts described herein.

The first controller 115 may manage and control overall operations of the first electronic device 110. For example, the first controller 115 may process and manage data and signals exchanged through the first interface circuit 113. The first electronic device 110 may perform functions according to control of the first controller 115.

The second electronic device 120 may be connected to the first electronic device 110 through the second interface circuit 123. The second electronic device 120 may exchange data and signals with the first electronic device 110 through the second interface circuit 123. In one example, the second electronic device 120 may exchange differential signals with the first electronic device 110.

The second interface circuit 123 may include a second physical layer PL2. The second physical layer PL2 may include physical components for exchanging data with the first electronic device 110. For example, the second physical layer PL2 may include one or more transmitting circuits and one or more receiving circuits for exchanging data with the first electronic device 110.

When the electronic system 100 is a mobile electronic system, for example, the second physical layer PL2 may be defined by the M-PHY specification. In this example, the second interface circuit 123 may further include a link layer (not shown) and a physical adapted layer (not shown).

The second controller 125 may manage and control overall operations of the second electronic device 120. In one example, the second controller 125 may process and manage data exchanged through the second interface circuit 123. The second electronic device 120 may perform functions according to a control of the second controller 125.

When the second electronic device 120 is a storage device including a flash memory, for example, the second controller 125 may operate in compliance with the interface protocol defined in the universal flash storage (UFS) specification. In this example, when the first electronic device 110 is a host, the first controller 115 may operate in compliance with the interface protocol defined in the UFS host controller interface (UFSHCI) specification. However, example embodiments are not limited to this example.

In another example, when the second electronic device 120 is an image sensor, the second controller 125 may operate in compliance with the interface protocol referred to as the camera serial interface (CSI). Example embodiments may also be applied to any interface circuit including a physical layer, and changes or modifications to example embodiments may be made according to interfacing methods.

Figure 2:
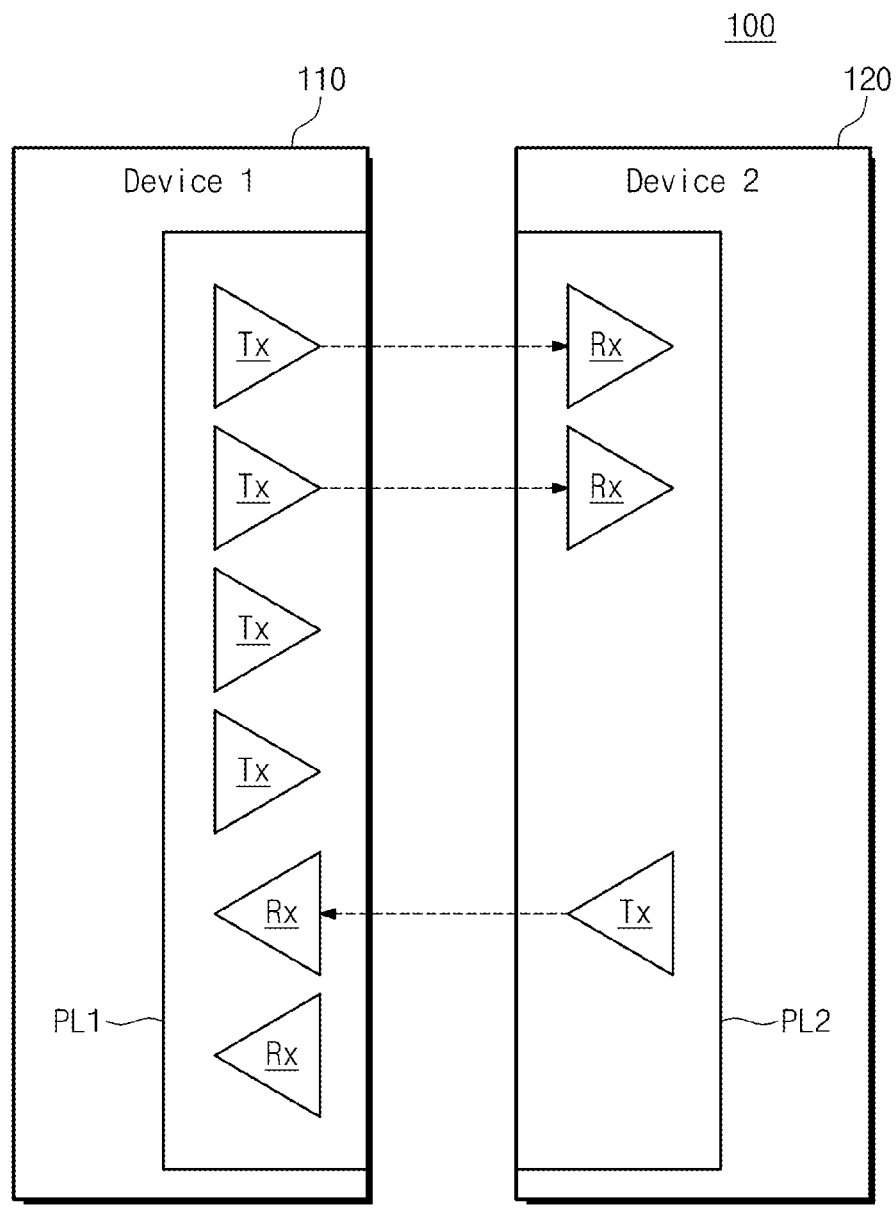
FIG. 2 is a conceptual diagram illustrating an example connection between interface circuits of the two electronic devices shown in FIG. 1.

FIG. 2 is a conceptual diagram illustrating an example connection between interface circuits of the two electronic devices shown in FIG. 1. As described with reference to FIG. 1, the electronic system 100 may include the first electronic device 110 and the second electronic device 120, which are connected to each other.

The first electronic device 110 may be connected to the second electronic device 120 through a first physical layer PL1. The second electronic device 120 may be connected to the first electronic device 110 through a second physical layer PL2. Each of the first physical layer PL1 and the second physical layer PL2 may include one or more transmitting circuits Tx and one or more receiving circuits Rx.

In the first physical layer PL1, the number of transmitting circuits Tx and the number of receiving circuits Rx may be variously changed according to a type or kind of the first electronic device 110. In the second physical layer PL2, the number of transmitting circuits Tx and the number of receiving circuits Rx may be variously changed according to a type or a kind of the second electronic device 120. When the type of the first electronic device 110 is different from the type of the second electronic device 120, the number of transmitting circuits Tx and receiving circuits Rx of the first physical layer PL1 may be different from the number of transmitting circuits Tx and receiving circuits Rx of the second physical layer PL2. However, the configuration illustrated in FIG. 2 is an example to help understanding of inventive concepts, and inventive concepts are not limited thereto.

A transmitting circuit Tx and a receiving circuit Rx that are connected to each other may constitute one "lane". A transmitting circuit Tx may send signals and data to a receiving circuit Rx connected thereto. A receiving circuit Rx may receive signals and data from a transmitting circuit Tx connected thereto. However, a transmitting circuit Tx that is not connected to a receiving circuit Rx and a receiving circuit Rx that is not connected to a transmitting circuit Tx may not operate or may not be used. A configuration of a receiving circuit Rx according to an example embodiment will be more described with reference to FIG. 3.

Figure 3:
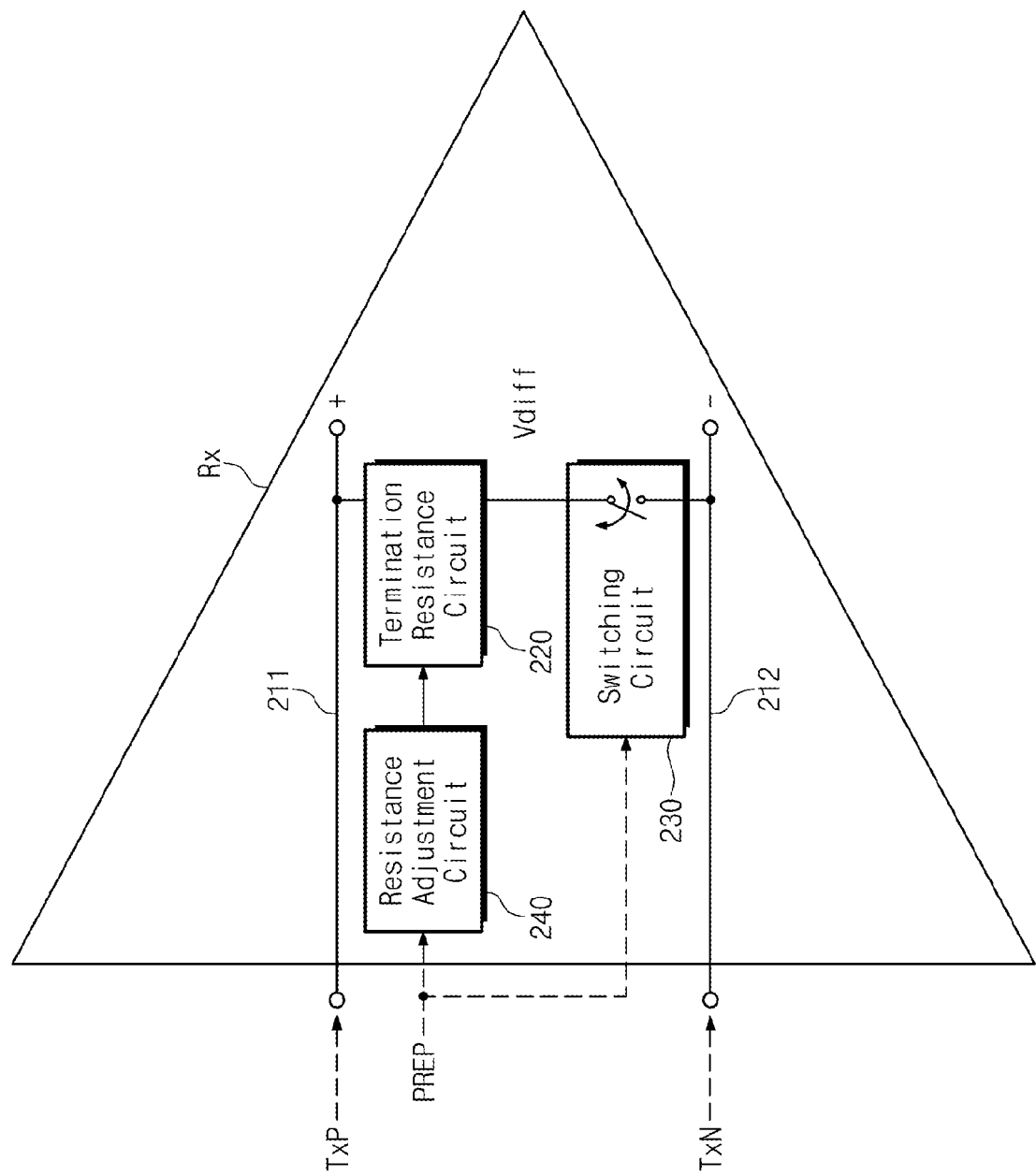
FIG. 3 is a block diagram illustrating a receiving circuit according to an example embodiment.

FIG. 3 is a block diagram illustrating a receiving circuit according to an example embodiment.

Referring to FIG. 3, a receiving circuit Rx may include a first transmission route 211, a second transmission route 212, a termination resistance circuit (or block) 220, a switching circuit (or block) 230, and a resistance adjustment circuit (or block) 240. The receiving circuit Rx may receive signals and data from a transmitting circuit (not shown in FIG. 3) that is connected with the receiving circuit Rx. In one example, the receiving circuit Rx may receive differential signals from the transmitting circuit connected thereto. The first transmission route 211 and the second transmission route 212 may also be referred to as input terminals.

The first transmission route 211 and the second transmission route 212 may be respectively connected to differential output terminals TxP and TxN of the transmitting circuit that is connected to the receiving circuit Rx. The first transmission route 211 and the second transmission route 212 may receive differential signals from the transmitting circuit that is connected to the receiving circuit Rx. The first transmission route 211 and the second transmission route 212 may transmit the received differential signal. Based on the received differential signal, a differential voltage Vdiff may be generated between the first transmission route 211 and the second transmission route 212. The receiving circuit Rx may recognize signals or data transmitted from the transmitting circuit, based on a value of the differential voltage Vdiff.

The termination resistance circuit 220 may be connected between the first transmission route 211 and the second transmission route 212. As an example, when the differential signal is transmitted through the first transmission route 211 and the second transmission route 212, the termination resistance circuit 220 may be connected between the first transmission route 211 and the second transmission route 212. Distortion of the differential signal may be suppressed and/or prevented by connecting the termination resistance circuit 220 to the first transmission route 211 and the second transmission route 212 when the differential signal is being transmitted. When a transmission of the differential signal ends or stops, the termination resistance circuit 220 may be disconnected from at least one of the first transmission route 211 and the second transmission route 212.

In at least one example embodiment, the termination resistance circuit 220 may have an adjustable resistance value. In one example, the resistance value of the termination resistance circuit 220 may be adjusted between a first resistance value and a second resistance value. Below, it is assumed that the second resistance value is less than the first resistance value. When the resistance value of the termination resistance circuit 220 is adjusted according to one or more example embodiments, influence on the transmitting circuit due to sudden current flowing through the termination resistance circuit 220 may be reduced. A configuration of the termination resistance circuit 220 and effects obtained by an example embodiment will be described in more detail later with reference to FIGS. 6 through 9.

In one example, the first resistance value and the second resistance value may be determined in advance. In another example, the first resistance value and the second resistance value may be variable and/or programmable. In this example, the first resistance value and the second resistance value may be varied and/or programmed to have appropriate values, as necessary.

The switching circuit 230 may control a connection between the first and second transmission routes 211 and 212 and the termination resistance circuit 220. When the differential signal is transmitted, the termination resistance circuit 220 may be connected to the first transmission route 211 and the second transmission route 212 according to a control of the switching circuit 230. When the transmission of the differential signal ends or stops, the termination resistance circuit 220 may be disconnected from at least one of the first transmission route 211 and the second transmission route 212 according to a control of the switching circuit 230.

FIG. 3 illustrates that the switching circuit 230 includes a switch element. However, the switching circuit 230 may be implemented with various types of units, such as a transistor element, a gate circuit, and so on. The switching circuit 230 may be implemented with any type of element or circuit for controlling a connection between the first and second transmission routes 211 and 212 and the termination resistance circuit 220.

Further, FIG. 3 illustrates that the switching circuit 230 is connected between the termination resistance circuit 220 and the second transmission route 212. However, the switching circuit 230 may be connected between the termination resistance circuit 220 and the first transmission route 211. Alternatively, the switching circuit 230 may control both a connection between the termination resistance circuit 220 and the first transmission route 211 and a connection between the termination resistance circuit 220 and the second transmission route 212. The configuration shown in FIG. 3 is an example to help understanding of inventive concepts, and not intended to be limiting.

According to at least one example embodiment, the switching circuit 230 may operate in response to a signal reception preparation command PREP. The signal reception preparation command PREP may be a command notifying the receiving circuit Rx that the differential signal is expected to be transmitted by the transmitting circuit. The signal reception preparation command PREP may be provided by the transmitting circuit through the first transmission route 211 and the second transmission route 212. Before the signal reception preparation command PREP is provided, the termination resistance circuit 220 may be disconnected from at least one of the first transmission route 211 and the second transmission route 212. However, when the signal reception preparation command PREP is provided, the switching circuit 230 may connect the termination resistance circuit 220 to the first transmission route 211 and the second transmission route 212.

Herein, the term "signal reception preparation command" is not intended to limit inventive concepts. The signal reception preparation command PREP may be configured in the form of a data value, a signal pattern, or any other form. An example associated with the signal reception preparation command PREP will be described in more detail with reference to FIG. 5.

The resistance adjustment circuit 240 may adjust the resistance value of the termination resistance circuit 220. For example, when the termination resistance circuit 220 is disconnected from at least one of the first transmission route 211 and the second transmission route 212, and then connected to the first transmission route 211 and the second transmission route 212 according to a control of the switching circuit 230, the resistance adjustment circuit 240 may adjust the resistance value of the termination resistance circuit 220. The resistance adjustment circuit 240 may adjust the resistance value of the termination resistance circuit 220 from the first resistance value to the second resistance value. That is, for example, the second resistance value may be understood as a "target resistance value" of the termination resistance circuit 220.

According to at least one example embodiment, the resistance adjustment circuit 240 may begin to adjust the resistance value of the termination resistance circuit 220 in response to the signal reception preparation command PREP. In one example, the resistance adjustment circuit 240 may stepwise adjust the resistance value of the termination resistance circuit 220 from the first resistance value to the second resistance value. This example embodiment will be described in more detail with reference to FIGS. 6 and 7. In another example, the resistance adjustment circuit 240 may gradually adjust the resistance value of the termination resistance circuit 220 from the first resistance value to the second resistance value. This example embodiment will be described in more detail with reference to FIGS. 8 and 9.

As described above, the receiving circuit Rx may be included in a physical layer of an interface circuit. According to at least one example embodiment, when the receiving circuit Rx is implemented in a mobile electronic system, the physical layer including the receiving circuit Rx may be defined based on the M-PHY specification. In this example, the first transmission route 211, the second transmission route 212, the termination resistance circuit 220, switching circuit 230, and the resistance adjustment circuit 240 may be included in the physical layer defined based on the M-PHY specification. However, example embodiments are not limited to this example. Rather, inventive concepts may be applied to any interface circuit including a physical layer.

Figure 4:
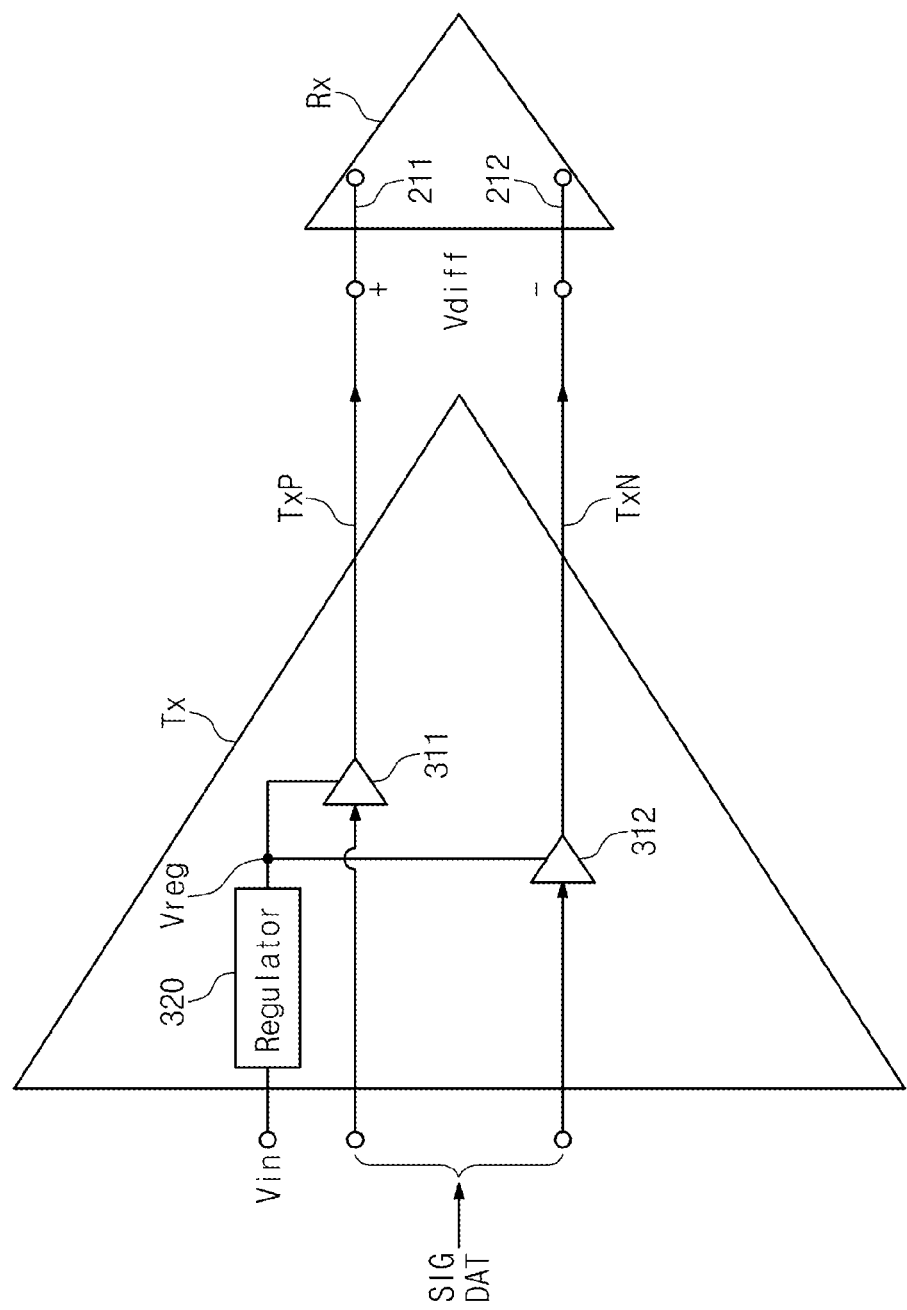
FIG. 4 is a conceptual diagram illustrating an example connection between the receiving circuit shown in FIG. 3 and a transmitting circuit.

FIG. 4 is a conceptual diagram illustrating an example connection between the receiving circuit shown in FIG. 3 and a transmitting circuit.

Referring to FIG. 4, the receiving circuit Rx may include the first transmission route 211 and the second transmission route 212. For brevity of the description, illustrations of the termination resistance circuit 220, the switching circuit 230, and the resistance adjustment circuit 240, which are shown in FIG. 3, are omitted from FIG. 4. A transmitting circuit Tx may include drivers 311 and 312 and a regulator 320. Each of the receiving circuit Rx and the transmitting circuit Tx may further include other components not illustrated in FIG. 4. The configuration shown in FIG. 4 is an example to help understanding of inventive concepts, not to be limiting.

As described with reference to FIG. 3, the receiving circuit Rx may receive a differential signal from the transmitting circuit Tx connected thereto. The first transmission route 211 and the second transmission route 212 may be respectively connected to differential output terminals TxP and TxN of the transmitting circuit Tx. The first transmission route 211 and the second transmission route 212 may receive the differential signal from the transmitting circuit Tx. The first transmission route 211 and the second transmission route 212 may transmit the received differential signal. Based on the received differential signal, a differential voltage Vdiff may be generated between the first transmission route 211 and the second transmission route 212.

The drivers 311 and 312 may receive a signal SIG and data DAT from another component of the electronic device including the transmitting circuit Tx. The drivers 311 and 312 may be respectively connected to the differential output terminals TxP and TxN. The drivers 311 and 312 may transmit the differential signal corresponding to the signal SIG and the data DAT to the receiving circuit Rx through the differential output terminals TxP and TxN.

The regulator 320 may regulate an input voltage Vin to output a regulation voltage Vreg. In one example, the input voltage Vin may be provided from a power supply, a battery, or another regulator. For instance, the regulator 320 may be a low dropout regulator, but inventive concepts are not limited thereto. A kind or type of the regulator 320 may be variously changed as necessary.

The regulation voltage Vreg may be provided to the drivers 311 and 312. The regulation voltage Vreg may be used to generate the differential signal to be output through the differential output terminals TxP and TxN.

Meanwhile, when the differential signal is transmitted to the receiving circuit Rx and the termination resistance circuit 220 (refer to FIG. 3) is connected between the first transmission route 211 and the second transmission route 212, the regulation voltage Vreg may fluctuate due to sudden current flow through the termination resistance circuit 220. This will be described in more detail below with reference to FIG. 5.

Figure 5:
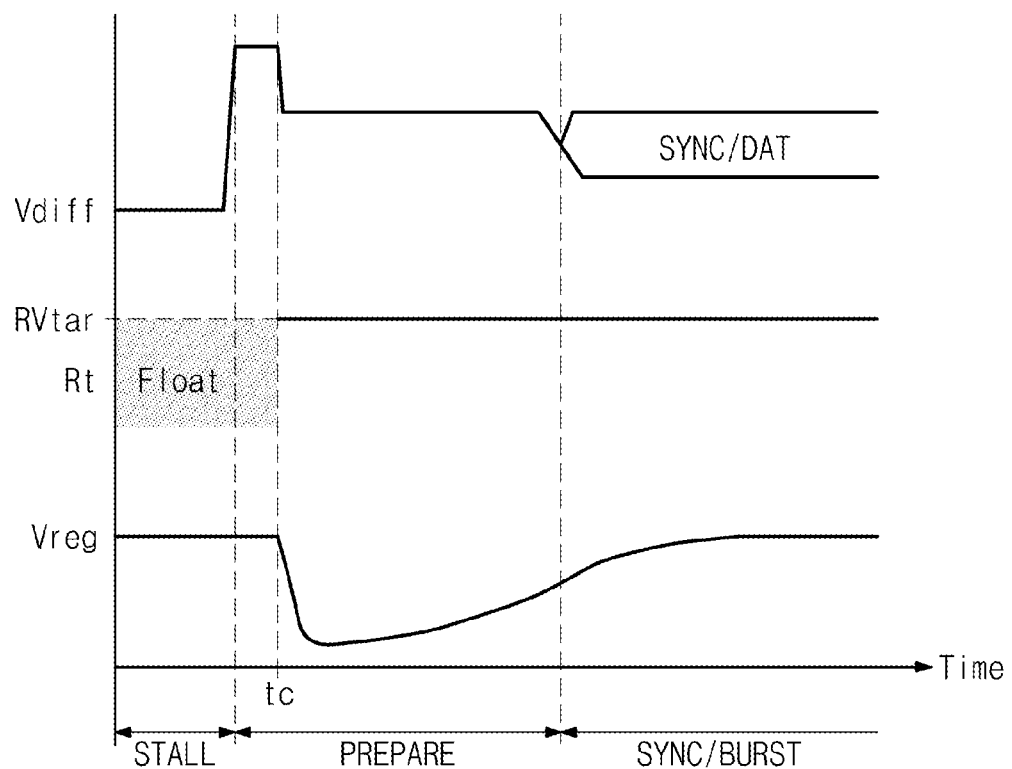
FIG. 5 is a graph showing example influence on a transmitting circuit due to sudden current flow through a termination resistance circuit of a receiving circuit.

FIG. 5 is a graph showing example influence on a transmitting circuit due to sudden current flow through a termination resistance circuit of a receiving circuit. In particular, FIG. 5 describes a case where a resistance adjustment circuit 240 (refer to FIG. 3) does not operate (e.g., a resistance value Rt of a termination resistance circuit 220 is not adjusted). In order to help understanding of inventive concepts, FIGS. 3 and 4 are referred to together with reference to FIG. 5. Further, it is assumed that a physical layer including a receiving circuit Rx (refer to FIG. 3) is defined based on the M-PHY specification. However, this assumption is not intended to limit inventive concepts.

When no differential signal is transmitted through a first transmission route 211 and a second transmission route 212, the termination resistance circuit 220 may be disconnected from at least one of the first transmission route 211 and the second transmission route 212. That is, for example, the termination resistance circuit 220 may float from at least one of the first transmission route 211 and the second transmission route 212. This state may correspond to a "STALL" state of a high-speed mode (or a "SLEEP" state of a low-speed mode) that is defined in the M-PHY specification. In this state, no current may flow through the termination resistance circuit 220, and the receiving circuit Rx consumes relatively little power.

Before transfer of the differential signal begins, a signal reception preparation command PREP may be provided from a transmitting circuit Tx to the receiving circuit Rx. For instance, an increase in a voltage value of the differential voltage Vdiff may correspond to the signal reception preparation command PREP. In this example, when the receiving circuit Rx senses the increase in the voltage value of the differential voltage Vdiff, a state of a physical layer including the receiving circuit Rx may transition from the STALL state to a "PREPARE" state.

The receiving circuit Rx may set conditions for receiving the differential signal in the PREPARE state. In particular, at time 'tc' of the PREPARE state, the termination resistance circuit 220 having a target resistance value RVtar may be connected to the first transmission route 211 and the second transmission route 212. Once the termination resistance circuit 220 is connected, current may suddenly begin to flow through the termination resistance circuit 220. Thus, at time 'tc', the voltage value of the differential voltage Vdiff may decrease (e.g., by a relatively small amount). In addition, a regulation voltage Vreg may fluctuate due to the sudden current flowing through the termination resistance circuit 220.

After the PREPARE state ends, the physical layer including the receiving circuit Rx may perform a synchronization operation in a "SYNC" state, and may receive data corresponding to the differential signal in a "BURST" state. However, when the regulation voltage Vreg fluctuates considerably in the PREPARE state, the regulation voltage Vreg may not become stable in the SYNC state. When the regulation voltage Vreg fluctuates in the SYNC state, a signal transmitted in the SYNC state may include noise. When the receiving circuit Rx (e.g., abnormally) recognizes the noise as a control signal pattern or data, an error upon interfacing and data exchanging may occur.

According to an example embodiment, to reduce the influence on a transmitting circuit due to sudden current flowing through the termination resistance circuit 220, the resistance adjustment circuit 240 may adjust the resistance value of the termination resistance circuit 220. Effects obtained by one or more example embodiments will be described in more detail below with reference to FIGS. 6 through 9.

Figure 6:
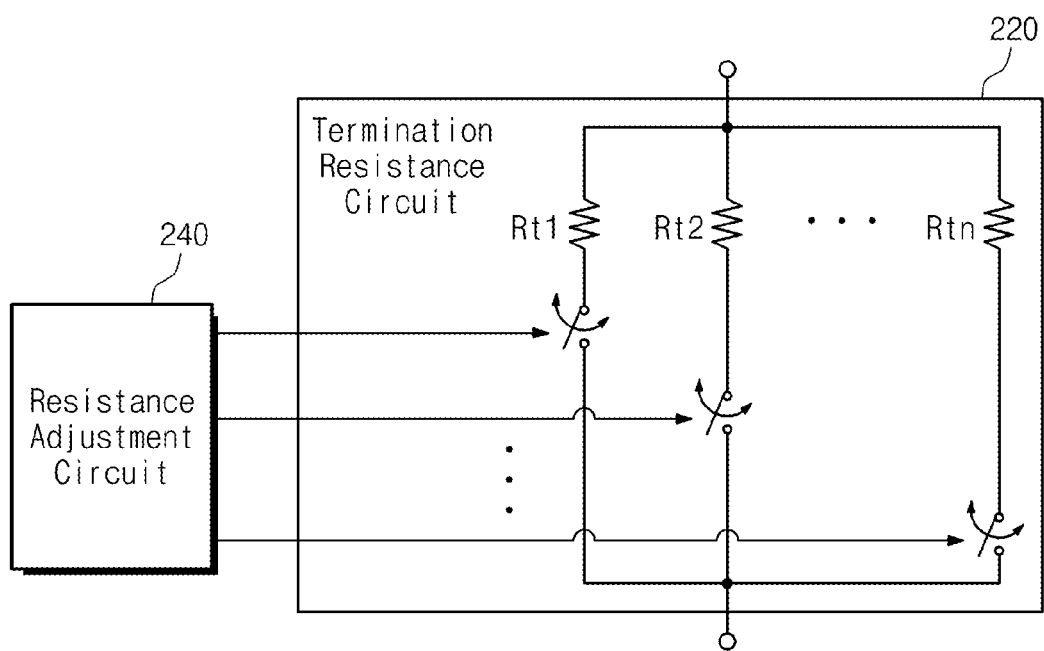
FIG. 6 is a block diagram illustrating an example embodiment of a termination resistance circuit included in the receiving circuit shown in FIG. 3.

FIG. 6 is a block diagram illustrating an example embodiment of a termination resistance circuit included in the receiving circuit shown in FIG. 3.

Referring to FIG. 6, a termination resistance circuit 220 may include a plurality of resistive elements Rt1, Rt2, and Rtn. Each of the resistive elements Rt1, Rt2, and Rtn may be implemented as a discrete resistor, a transistor, or another element. The number of the resistive elements Rt1, Rt2, and Rtn may be variously changed as necessary. In this example embodiment, a resistance value of the termination resistance circuit 220 may be adjusted according to the number of resistive elements connected to a first transmission route 211 (refer to FIG. 3) and a second transmission route 212 (refer to FIG. 3) from among the resistive elements Rt1, Rt2, and Rtn.

In order to adjust the resistance value of the termination resistance circuit 220, the resistance adjustment circuit 240 may control a connection between each of the resistive elements Rt1, Rt2, and Rtn and the first and the second transmission routes 211 and 212. The resistance adjustment circuit 240 may adjust the number of resistive elements connected between the first transmission route 211 and the second transmission route 212 to adjust the resistance value of the termination resistance circuit 220.

In the example embodiment shown in FIG. 6, the resistance adjustment circuit 240 may stepwise decrease the resistance value of the termination resistance circuit 220 from a first resistance value to a second resistance value.

As an example to help understanding of inventive concepts, it is assumed that a target resistance value (the second resistance value) of the termination resistance circuit 220 for suppressing and/or preventing distortion of a differential signal is about 100 Ohms. Further, it is assumed that the termination resistance circuit 220 includes four resistive elements, each of which has a resistance value of about 800 Ohms and which are connected in parallel.

In this example, when the termination resistance circuit 220 is connected to the first transmission route 211 and the second transmission route 212 according to a control of a switching circuit 230 (refer to FIG. 3), the resistance adjustment circuit 240 may control the termination resistance circuit 220 such that one of the four resistive elements is connected to the first transmission route 211 and the second transmission route 212. Accordingly, the resistance value of the termination resistance circuit 220 may become about 800 Ohms. In this example, the first resistance value of the termination resistance circuit 220 may be about 800 Ohms.

After time elapses, the resistance adjustment circuit 240 may control the termination resistance circuit 220 such that another one of the four resistive elements is connected to the first transmission route 211 and the second transmission route 212. Accordingly, the resistance value of the termination resistance circuit 220 may become about 400 Ohms. After time elapses further, the resistance adjustment circuit 240 may control the termination resistance circuit 220 such that still another one of the four resistive elements is connected to the first transmission route 211 and the second transmission route 212. Accordingly, the resistance value of the termination resistance circuit 220 may become about 200 Ohms. After time elapses, the resistance adjustment circuit 240 may control the termination resistance circuit 220 such that all four resistive elements are connected to the first transmission route 211 and the second transmission route 212. Accordingly, the termination resistance circuit 220 may have the resistance value of about 100 Ohms, which is the target resistance value (the second resistance value).

According to the above-discussed example, the resistance adjustment circuit 240 may stepwise decrease the resistance value of the termination resistance circuit 220 from about 800 Ohms, which is the first resistance value, to about 100 Ohms, which is the second (target) resistance value. When the resistance value of the termination resistance circuit 220 is adjusted from a value greater than the target resistance value to the target resistance value, intensity of current flowing through the termination resistance circuit 220 may increase more gradually (e.g., little by little). Thus, the influence on a transmitting circuit due to the current flowing through the termination resistance circuit 220 may be reduced.

The above-discussed example is provided to help understanding of inventive concepts, and is not intended to limit inventive concepts. The number of resistive elements, a resistance value of each resistive element, connection of the resistive elements, the first resistance value, and the second resistance value may be variously changed as necessary. Further, a time interval between adjusting the resistance value of the termination resistance circuit 220 may have an appropriate value as necessary. The time interval between adjusting the resistance value of the termination resistance circuit 220 may be determined in advance. Alternatively, the time interval between adjusting the resistance value of the termination resistance circuit 220 may be programmable and/or variable.

Figure 7:
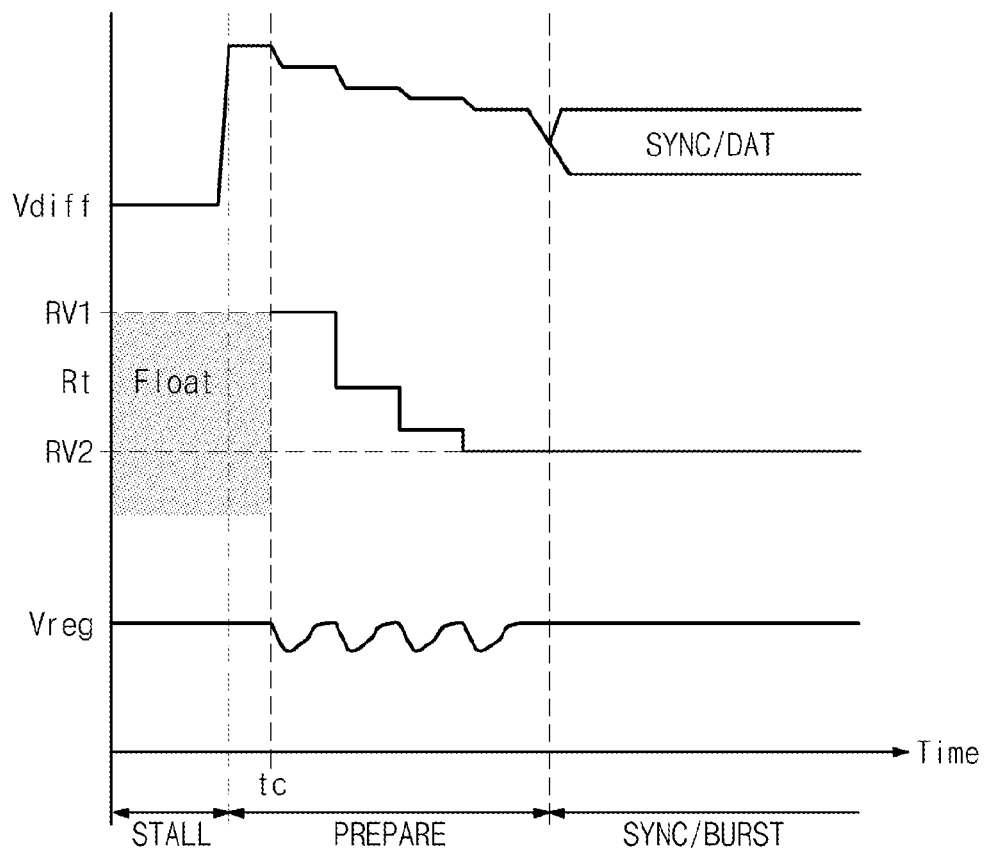
FIG. 7 is a graph showing an example effect obtained by adjusting a resistance value of the termination resistance circuit shown in FIG. 6.

FIG. 7 is a graph showing an example effect obtained by adjusting a resistance value of the example embodiment of the termination resistance circuit shown in FIG. 6. Unlike FIG. 5, FIG. 7 describes a case where a resistance adjustment circuit 240 (refer to FIG. 6) adjusts a resistance value Rt of a termination resistance circuit 220 (refer to FIG. 6). In order to help understanding of inventive concepts, FIGS. 3 and 4 are referred to together. Further, it is assumed that a physical layer including a receiving circuit Rx is defined based on the M-PHY specification. However, this assumption is not intended to limit inventive concepts.

In a STALL state, a differential signal may not be transmitted through a first transmission route 211 and a second transmission route 212. In order to reduce power consumed by the receiving circuit Rx, the termination resistance circuit 220 may be disconnected from at least one of the first transmission route 211 and the second transmission route 212. When the receiving circuit Rx senses a signal reception preparation command PREP (e.g., an increase in a voltage value of the differential voltage Vdiff), a state of the physical layer including the receiving circuit Rx may transition from the STALL state to a PREPARE state.

The receiving circuit Rx may set conditions for receiving the differential signal in the PREPARE state. In more detail, at time 'tc', the termination resistance circuit 220 may be connected to the first transmission route 211 and the second transmission route 212 according to a control of the switching circuit 230.

When the termination resistance circuit 220 is connected to the first transmission route 211 and the second transmission route 212, the resistance adjustment circuit 240 may stepwise decrease the resistance value Rt of the termination resistance circuit 220 from a first resistance value RV1 to a second resistance value RV2. For example, as described with reference to FIG. 6, the termination resistance circuit 220 having a resistance value of about 100 Ohms is not immediately connected to the first transmission route 211 and the second transmission route 212, but the resistance value Rt of the termination resistance circuit 220 may be sequentially adjusted in order of about 800 Ohms, about 400 Ohms, about 200 Ohms, and about 100 Ohms. A voltage value of a differential voltage Vdiff may decrease as the resistance value Rt of the termination resistance circuit 220 decreases.

When the resistance value Rt of the termination resistance circuit 220 is relatively high, the intensity of current flowing through the termination resistance circuit 220 may be relatively small. Thus, a regulation voltage Vreg may not undergo relatively large fluctuation. As the resistance value Rt of the termination resistance circuit 220 decreases (e.g., little by little or stepwise), the intensity of current flowing through the termination resistance circuit 220 may increase (e.g., little by little or stepwise). Thus, the regulation voltage Vreg may not largely fluctuate until the termination resistance circuit 220 has a target resistance value. As a result, the regulation voltage Vreg may become relatively stable in a SYNC state.

According to at least some example embodiments, the regulation voltage Vreg may become relatively stable in the SYNC state by stepwise decreasing the resistance value Rt of the termination resistance circuit 220 instead of immediately connecting the termination resistance circuit 220 having the target resistance value to the first transmission route 211 and the second transmission route 212. Thus, a signal transmitted in the SYNC state may include only relatively little or no noise. Further, interfacing and data exchanging may be performed normally.

After the PREPARE state ends, a physical layer including the receiving circuit Rx may perform a synchronization operation in the SYNC state and may receive data corresponding to the differential signal in a BURST state. In particular, for example, after the resistance value Rt of the termination resistance circuit 220 is set to the second resistance value RV2, which is the target resistance value, in the BURST state, the first transmission route 211 and the second transmission route 212 may transmit the differential signal.

According to at least one example embodiment, the resistance value Rt of the termination resistance circuit 220 may be maintained with the second resistance value RV2, which is the target resistance value, until a transmission of the differential signal ends or stops. Once the resistance value Rt of the termination resistance circuit 220 is set to the second resistance value RV2, the resistance value Rt of the termination resistance circuit 220 may be maintained with the second resistance value RV2 until the termination resistance circuit 220 is disconnected from at least one of the first transmission route 211 and the second transmission route 212.

When the transmission of the differential signal ends or stops, the termination resistance circuit 220 may be disconnected from at least one of the first transmission route 211 and the second transmission route 212 according to a control of the switching circuit 230. Accordingly, the amount of power consumed by the receiving circuit Rx may be reduced.

According to one or more example embodiments, the influence on a transmitting circuit Tx due to current flowing through the termination resistance circuit 220 may be reduced. Moreover, even though a characteristic of the transmitting circuit Tx is not good or relatively bad, the characteristic of the transmitting circuit Tx may be complemented.

Figure 8:
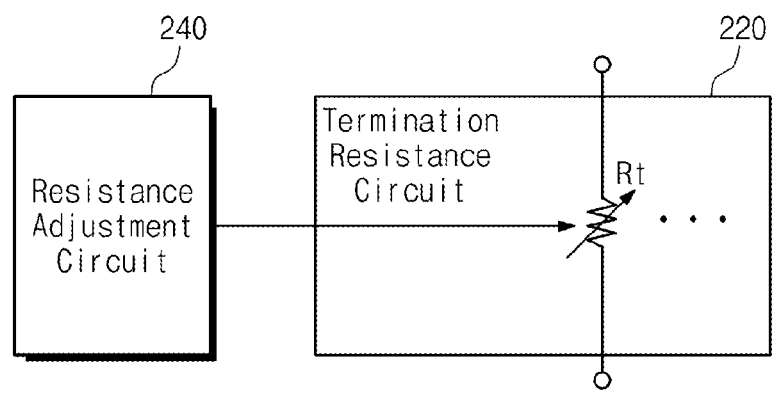
FIG. 8 is a block diagram illustrating an example embodiment of a termination resistance circuit included in the receiving circuit shown in FIG. 3.

FIG. 8 is a block diagram illustrating an example embodiment of a termination resistance circuit included in the receiving circuit shown in FIG. 3.

Referring to FIG. 8, a termination resistance circuit 220 may include a variable resistive element Rt. The variable resistive element Rt may be implemented as a discrete resistor, a transistor, or another element. However, inventive concepts should not be limited thereto. The termination resistance circuit 220 may include one or more variable resistive elements. The number of variable resistive elements may be variously changed as necessary. In this example embodiment, a resistance value of the termination resistance circuit 220 may be adjusted according to a resistance value of the variable resistive element Rt. When the termination resistance circuit 220 includes two or more variable resistive elements, the resistance value of the termination resistance circuit 220 may be adjusted according to a resistance value of each of the two or more variable resistive elements.

A resistance adjustment circuit 240 may control a resistance value of the variable resistive element Rt to adjust the resistance value of the termination resistance circuit 220. The resistance adjustment circuit 240 may adjust a resistance value of at least one of the one or more variable resistive elements to adjust the resistance value of the termination resistance circuit 220. In more detail, in the example embodiment shown in FIG. 8, the resistance adjustment circuit 240 may gradually decrease the resistance value of the termination resistance circuit 220 from a first resistance value to a second resistance value.

As an example to help understanding of inventive concepts, it is assumed that a target resistance value (a second resistance value) of the termination resistance circuit 220 for suppressing and/or preventing distortion of a differential signal is about 100 Ohms. Further, it is assumed that the termination resistance circuit 220 includes at least one variable resistive element of which the resistance value is adjusted within a range from about 100 Ohms to about 800 Ohms.

In this example, when the termination resistance circuit 220 is connected to the first transmission route 211 and the second transmission route 212 according to a control of a switching circuit 230 (refer to FIG. 3), the resistance adjustment circuit 240 may control the variable resistive element Rt such that the termination resistance circuit 220 has the resistance value of about 800 Ohms. In this example, the first resistance value of the termination resistance circuit 220 is about 800 Ohms.

As time elapses, the resistance adjustment circuit 240 may gradually decrease the resistance value of the variable resistive element Rt. As the resistance value of the variable resistive element Rt gradually decreases, the resistance value of the termination resistance circuit 220 may also gradually decrease. Finally, the resistance adjustment circuit 240 may set the resistance value of the variable resistive element Rt to about 100 Ohms. Accordingly, the termination resistance circuit 220 may have the resistance value of about 100 Ohms, which is the target resistance value (the second resistance value).

According to the above discussed example, the resistance adjustment circuit 240 may gradually decrease the resistance value of the termination resistance circuit 220 from about 800 Ohms, which is the first resistance value, to about 100 Ohms, which is the second resistance value. When the resistance value of the termination resistance circuit 220 is adjusted from a value greater than the target resistance value to the target resistance value, the intensity of current flowing through the termination resistance circuit 220 may increase little by little. Accordingly, the influence on a transmitting circuit due to current flowing through the termination resistance circuit 220 may be reduced.

The above-discussed example is provided to help understanding of inventive concepts, and is not intended to be limiting. The number of variable resistive elements, a resistance value of each variable resistive element, connection of the variable resistive elements, the first resistance value, and the second resistance value may be variously changed as necessary. A manner for adjusting the resistance value of the termination resistance circuit 220 may also be variously changed. For instance, the resistance value of the termination resistance circuit 220 may be adjusted linearly or non-linearly. A manner for adjusting the resistance value of the termination resistance circuit 220 may be determined in advance. Alternatively, a manner for adjusting the resistance value of the termination resistance circuit 220 may be programmable and/or variable.

Figure 9:
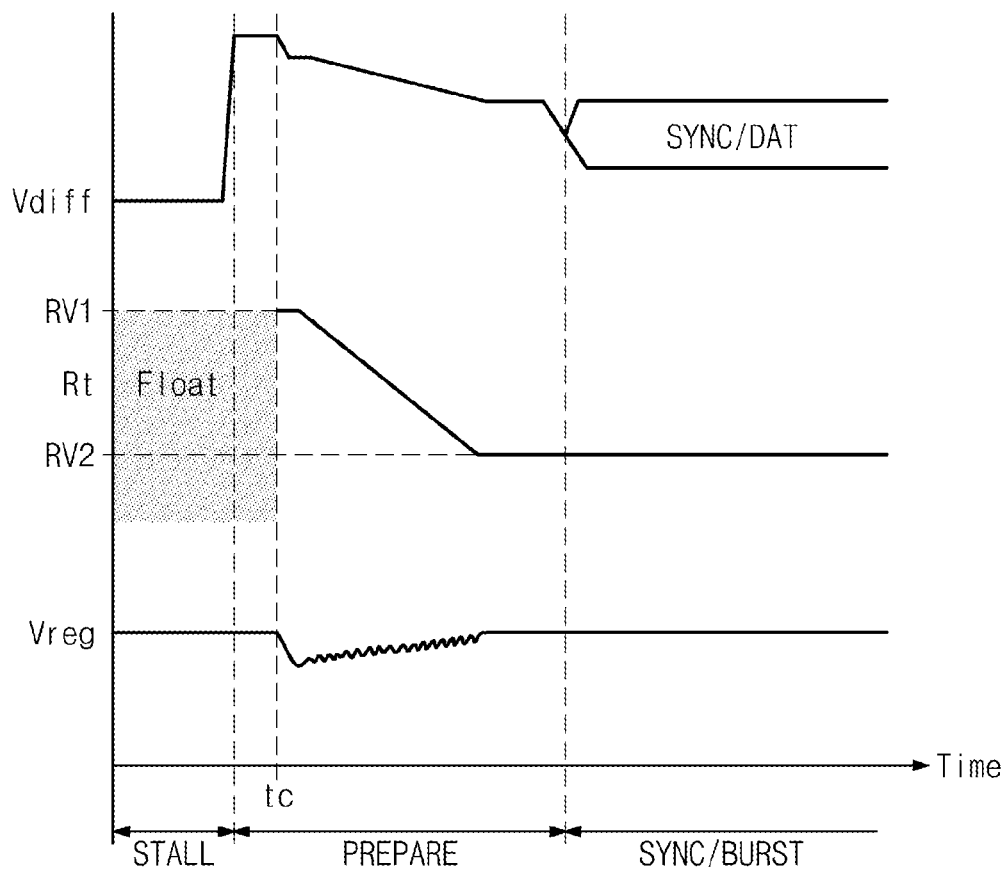
FIG. 9 is a graph showing an example effect obtained by adjusting a resistance value of the termination resistance circuit shown in FIG. 8.

FIG. 9 is a graph showing an example effect obtained by adjusting a resistance value of the termination resistance circuit shown in FIG. 8. Like FIG. 7, FIG. 9 describes a case where a resistance adjustment circuit 240 (refer to FIG. 8) adjusts a resistance value Rt of a termination resistance circuit 220 (refer to FIG. 8). In order to help understanding of inventive concepts, FIGS. 3 and 4 are referred to together. Further, it is assumed that a physical layer including a receiving circuit Rx is defined based on the M-PHY specification. However, this assumption is not intended to limit inventive concepts.

In a STALL state, a differential signal may not be transmitted through a first transmission route 211 and a second transmission route 212. Thus, in order to reduce power consumed by a receiving circuit Rx, the termination resistance circuit 220 may be disconnected from at least one of the first transmission route 211 and the second transmission route 212. When the receiving circuit Rx senses a signal reception preparation command PREP (e.g., an increase in a voltage value of the differential voltage Vdiff), a state of the physical layer including the receiving circuit Rx may transition from the STALL state to a PREPARE state.

The receiving circuit Rx may set conditions for receiving the differential signal in the PREPARE state. At time "tc", the termination resistance circuit 220 may be connected to the first transmission route 211 and the second transmission route 212 according to a control of the switching circuit 230.

According to at least one example embodiment, when the termination resistance circuit 220 is connected to the first transmission route 211 and the second transmission route 212, the resistance adjustment circuit 240 may gradually decrease a resistance value Rt of the termination resistance circuit 220 from a first resistance value RV1 to a second resistance value RV2. For instance, as described with reference to FIG. 8, the termination resistance circuit 220 having the resistance value of about 100 Ohms is not immediately connected to the first transmission route 211 and the second transmission route 212, but the resistance value Rt of the termination resistance circuit 220 may be adjusted from about 800 Ohms to about 100 Ohms. As illustrated in FIG. 9, the resistance value Rt of the termination resistance circuit 220 may be linearly adjusted (or, unlike FIG. 9, non-linearly). A voltage value of the differential voltage Vdiff may decrease as the resistance value Rt of the termination resistance circuit 220 decreases.

When the resistance value Rt of the termination resistance circuit 220 is relatively high, the intensity of current flowing through the termination resistance circuit 220 may be relatively low. Thus, a regulation voltage Vreg may not undergo large fluctuations. As the resistance value Rt of the termination resistance circuit 220 decreases (e.g., little by little), the intensity of current flowing through the termination resistance circuit 220 may increase (e.g., little by little). Thus, the regulation voltage Vreg may not fluctuate largely until the termination resistance circuit 220 has the target resistance value. As a result, the regulation voltage Vreg may become relatively stable in a SYNC state.

The regulation voltage Vreg may become relatively stable in the SYNC state by gradually decreasing the resistance value Rt of the termination resistance circuit 220 instead of immediately connecting the termination resistance circuit 220 having the target resistance value to the first transmission route 211 and the second transmission route 212. Thus, a signal transmitted in the SYNC state may include little or no noise. Further, interfacing and data exchanging may be performed normally.

After the PREPARE state ends, the physical layer including the receiving circuit Rx may perform a synchronization operation in the SYNC state and may receive data corresponding to the differential signal in a BURST state. In more detail, after the resistance value Rt of the termination resistance circuit 220 is set to the second resistance value RV2, which is the target resistance value, in the BURST state the first transmission route 211 and the second transmission route 212 may transmit the differential signal.

According to at lease one example embodiment, the resistance value Rt of the termination resistance circuit 220 may be maintained with the second resistance value RV2, which is the target resistance value, until a transmission of the differential signal ends or stops. Once the resistance value Rt of the termination resistance circuit 220 is set to the second resistance value RV2, the resistance value Rt of the termination resistance circuit 220 may be maintained at the second resistance value RV2 until the termination resistance circuit 220 is disconnected from at least one of the first transmission route 211 and the second transmission route 212.

When the transmission of the differential signal ends or stops, the termination resistance circuit 220 may be disconnected from at least one of the first transmission route 211 and the second transmission route 212. Accordingly, the amount of power consumed by the receiving circuit Rx may be reduced.

According to one or more example embodiments, the influence on a transmitting circuit Tx due to current flowing through the termination resistance circuit 220 may be reduced. According to one or more example embodiments, even though a characteristic of the transmitting circuit Tx is not good (or relatively bad), the characteristic of the transmitting circuit Tx may be complemented.

Figure 10:
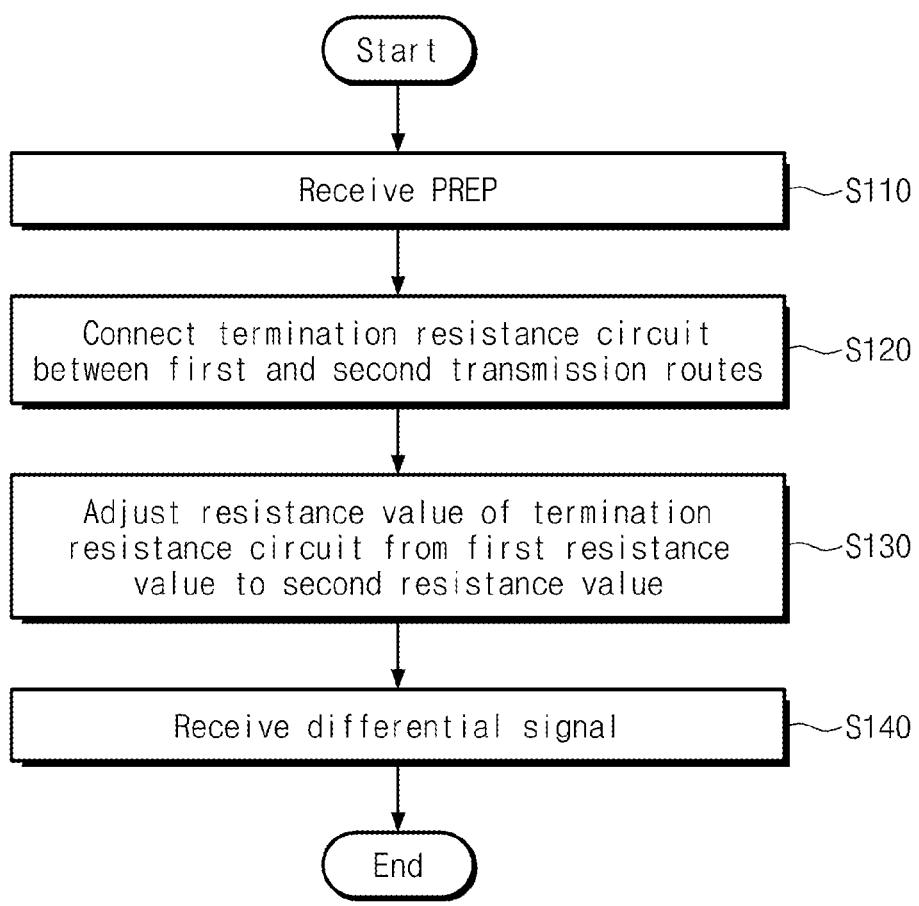
FIG. 10 is a flowchart describing an operating method of a receiving circuit, according to an example embodiment.

FIG. 10 is a flowchart describing an operating method of a receiving circuit according to an example embodiment. The method shown in FIG. 10 will be described with regard to a receiving circuit (e.g., FIG. 3) according to an example embodiment, which may be configured to receive a differential signal.

Referring to FIG. 10, in operation S110 the receiving circuit may receive a signal reception preparation command PREP. As described above, the signal reception preparation command PREP is a command notifying the receiving circuit that the differential signal is expected to be transmitted from a transmitting circuit, which is connected with the receiving circuit. The signal reception preparation command PREP may be provided by the transmitting circuit.

For example, the signal reception preparation command PREP may be provided through a first transmission route 211 (refer to FIG. 3) and a second transmission route 212 (refer to FIG. 3) that are configured to transmit the differential signal. In operation S110, a termination resistance circuit 220 (refer to FIG. 3) included in the receiving circuit may be disconnected from at least one of the first transmission route 211 and the second transmission route 212. In one example, when the receiving circuit is included in a physical layer defined based on the M-PHY specification, operation S110 may be performed in a STALL state (refer to FIGS. 7 and 9).

Still referring to FIG. 10, in operation S120, the termination resistance circuit 220 may be connected between the first transmission route 211 and the second transmission route 212. As described above, the termination resistance circuit 220 may be configured to have a resistance value that is adjusted between a first resistance value and a second resistance value. It is assumed that the second resistance value is smaller than the first resistance value. The second resistance value may be understood as a "target resistance value" of the termination resistance circuit 220.

In one example, when the receiving circuit includes a physical layer defined based on the M-PHY specification, operation S120 may be performed in a PREPARE state (refer to FIGS. 7 and 9). When the signal reception preparation command PREP is provided, the receiving circuit may connect the termination resistance circuit 220 between the first transmission route 211 and the second transmission route 212 in order to set conditions for receiving the differential signal. According to at least one example embodiment, operation S120 may be performed according to a control of a switching circuit 230 (refer to FIG. 3).

In operation S130, the resistance value of the termination resistance circuit 220 may be adjusted. Once the termination resistance circuit 220 is connected to the first transmission route 211 and the second transmission route 212, the resistance value of the termination resistance circuit 220 may be adjusted from the first resistance value to the second resistance value. According to at least one example embodiment, operation S130 may be performed according to a control of a resistance adjustment circuit 240 (refer to FIG. 4). Adjusting the resistance value of the termination resistance circuit 220 and effects obtained by an example embodiment of the present invention have been described above with reference to FIGS. 6 through 9.

In operation S140, the receiving circuit may receive the differential signal. Operation S140 may be performed after the resistance value of the termination resistance circuit 220 is set to the second resistance value. In addition, operation S140 may be performed after a signal reception preparation state (e.g., a PREPARE state defined in the M-PHY specification) that is initiated in response to the end of the signal reception preparation command PREP. That is, for example, the receiving circuit may receive the differential signal when conditions for receiving the differential signal are set.

Figure 11:
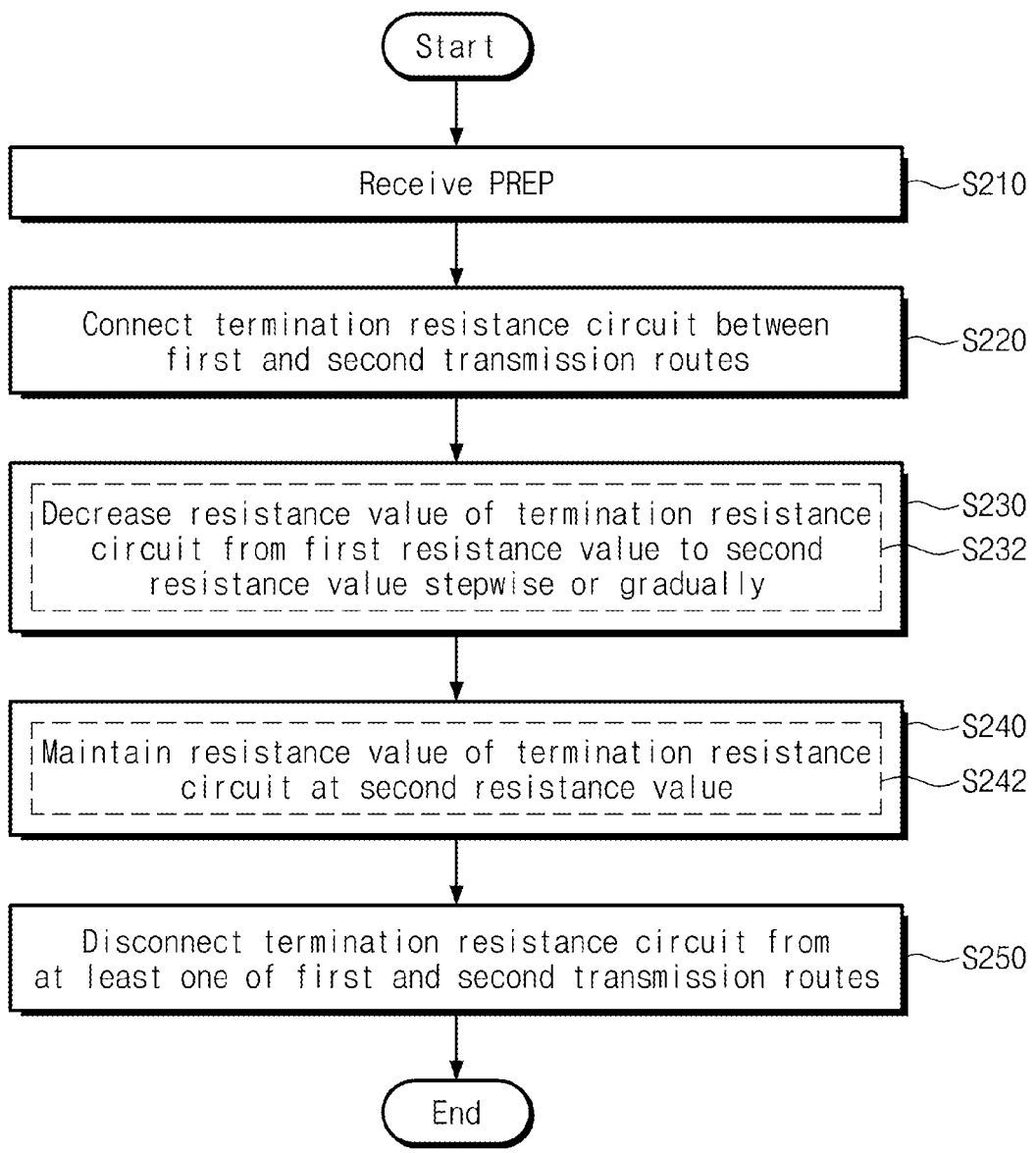
FIG. 11 is a detailed flowchart describing an operating method of a receiving circuit, according to another example embodiment.

FIG. 11 is a detailed flowchart describing an operating method of a receiving circuit according to another example embodiment. The method shown in FIG. 11 will also be described with regard to an example embodiment of a receiving circuit discussed herein (e.g., in FIG. 3).

Referring to FIG. 11, in operation S210, a receiving circuit may receive a signal reception preparation command PREP. In operation S220, a termination resistance circuit 220 (refer to FIG. 3) may be connected between a first transmission route 211 (refer to FIG. 3) and a second transmission route 212 (refer to FIG. 3). Operations S210 and S220 may be the same or substantially the same as operations S110 and S120 of FIG. 10. Therefore, redundant descriptions will be omitted below for brevity of the description.

In operation S230, a resistance value of the termination resistance circuit 220 may be adjusted. Operation S230 may include operation S130 of FIG. 10, and redundant descriptions thereof will be omitted below. Operation S230 may also include operation S232.

In operation S232, the resistance value of the termination resistance circuit 220 may stepwise decrease from a first resistance value to a second resistance value as described with reference to FIGS. 6 and 7. Alternatively, the resistance value of the termination resistance circuit 220 may gradually decrease from the first resistance value to the second resistance value as described with reference to FIGS. 8 and 9. According to one or more example embodiments, operation S232 may be performed according to a control of a resistance adjustment circuit 240 (refer to FIG. 3).

According to one or more example embodiments, the termination resistance circuit 220 having a target resistance value is not immediately connected to the first transmission route 211 and the second transmission route 212, but the resistance value of the termination resistance circuit 220 may stepwise and/or gradually decrease. According to one or more example embodiments, the influence on a transmitting circuit due to current flowing through the termination resistance circuit 220 may be reduced. Moreover, a regulation voltage regulated in the transmitting circuit may become relatively stable more quickly. Thus, interfacing and data exchanging may be performed normally. According to one or more example embodiments, even though a characteristic of the transmitting circuit is relatively bad (not good), the characteristic of the transmitting circuit may be complemented.

Referring back to FIG. 11, in operation S240 the receiving circuit may receive the differential signal. Operation S240 may include operation S140 of FIG. 10, and redundant descriptions thereof will be omitted for brevity. In addition, operation S240 may include operation S242.

In operation S242, the resistance value of the termination resistance circuit 220 may be maintained with the second resistance value. In one example, operation S242 may be performed according to a control of the resistance adjustment circuit 240. The resistance value of the termination resistance circuit 220 may be maintained with the second resistance value, which is the target resistance value, until a transmission of the differential signal ends or stops. Once the resistance value of the termination resistance circuit 220 is set to the second resistance value, the resistance value of the termination resistance circuit 220 may be maintained with the second resistance value until the termination resistance circuit 220 is disconnected from at least one of the first transmission route 211 and the second transmission route 212.

In operation S250, the termination resistance circuit 220 may be disconnected from at least one of the first transmission route 211 and the second transmission route 212. More particularly, when the transmission of the differential signal ends or stops, the termination resistance circuit 220 may be disconnected from at least one of the first transmission route 211 and the second transmission route 212. Thus, the amount of power consumed by the receiving circuit may be reduced. In at least one example embodiment, operation S250 may be performed according to a control of a switching circuit 230 (refer to FIG. 3).

Figure 12:
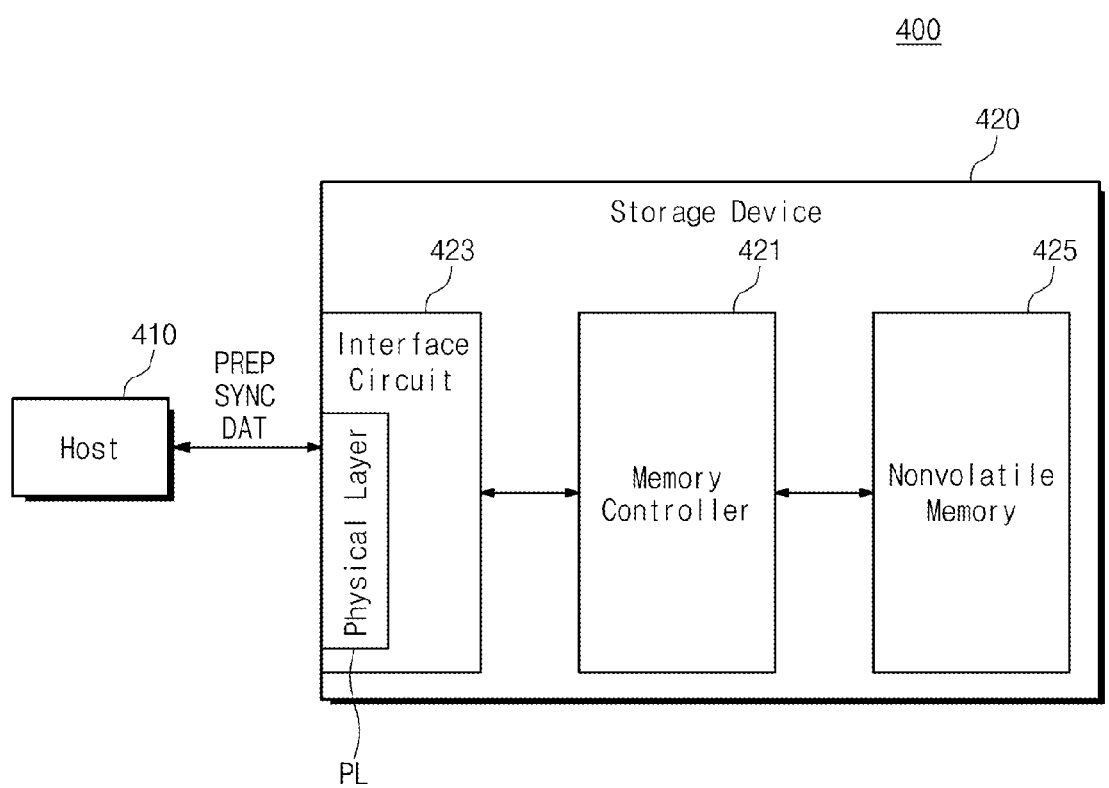
FIG. 12 is a block diagram illustrating a storage system according to an example embodiment.

FIG. 12 is a block diagram illustrating a storage system according to an example embodiment.

Referring to FIG. 12, a storage system 400 may include a host 410 and a storage device 420. The host 410 may be the first electronic device 110 of FIG. 1. In one example embodiment, the host 410 may include an application processor when the storage system 400 is implemented in a mobile electronic system.

The storage device 420 may be the second electronic device 120 of FIG. 1. The storage device 420 may include a memory controller 421, an interface circuit 423, and a nonvolatile memory 425. The interface circuit 423 may include a physical layer PL. However, the storage device 420 may further include other components not shown in FIG. 12. The configuration illustrated in FIG. 12 is an example to help understanding of inventive concepts.

The memory controller 421 may manage and control overall operations of the storage device 420. In particular, the memory controller 421 may process and manage data exchanged with the host 410 through the interface circuit 423. The storage device 420 may function according to a control of the memory controller 421.

In more detail, for example, the memory controller 421 may control the storage device 420 in response to a signal reception preparation command PREP and a synchronization command SYNC, which are provided through the interface circuit 423. The memory controller 421 may store data DAT provided from the host 410 through the interface circuit 423 in the nonvolatile memory 425, and may provide data DAT stored in the nonvolatile memory 425 to the host 410 through the interface circuit 423.

According to at least one example embodiment, the memory controller 421 may control the storage device 420 in compliance with the UFS interface protocol. However, inventive concepts are not limited thereto. For instance, the memory controller 421 may control the storage device 420 in compliance with one or more of various interface protocols, such as universal serial bus (USB), small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), and so on.

As mentioned above, the interface circuit 423 according to one or more example embodiments may include a physical layer PL. The interface circuit 423 may operate in compliance with the interface protocol that uses the physical layer PL. In particular, the interface circuit 423 may receive a differential signal from the host 410.

In at least one example embodiment, when the storage device 420 is implemented in a mobile electronic system, the physical layer PL may be defined by the M-PHY specification. However, inventive concepts are not limited thereto. The physical layer PL may include physical components (e.g., one or more transmitting circuits and one or more receiving circuits) for exchanging data with the host 410. In particular, for example, each of one or more receiving circuits included in the physical layer PL of the interface circuit 423 may be implemented based on one or more example embodiments.

More particularly, for example, a receiving circuit included in the physical layer PL of the interface circuits 423 may include a configuration of a receiving circuit Rx shown in FIG. 3. In addition, the receiving circuit included in the physical layer PL of the interface circuits 423 may include a termination resistance circuit 220 and a resistance adjustment circuit 240, which are described with reference to FIGS. 6 and 8. Further, the receiving circuit included in the physical layer PL of the interface circuits 423 may operate according to procedures and methods described with reference to FIGS. 7, 9, 10, and 11. Redundant descriptions will be omitted below for brevity.

The nonvolatile memory 425 may store data regardless of whether power is supplied. In particular, the nonvolatile memory 425 may store data corresponding to the differential signal received through the interface circuit 423. The nonvolatile memory 425 may store or output data according to a control of the memory controller 421.

The nonvolatile memory 425 may be a two-dimensional (2D) or three dimensional (3D) memory array. A 3D memory array is monolithically formed in physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Patent Application Publication No. 2011/0233648.

According to an example embodiment, the memory controller 421, the interface circuit 423, and the nonvolatile memory 425 may be implemented with an embedded storage that is configured to be embedded in a mobile electronic system. As another example embodiment, the memory controller 421, the interface circuit 423, and the nonvolatile memory 425 may be implemented with a card storage that is configured to be connected with a mobile electronic system. However, inventive concepts are not limited thereto. The storage device 420 may be implemented with another type of storage.

Figure 13:
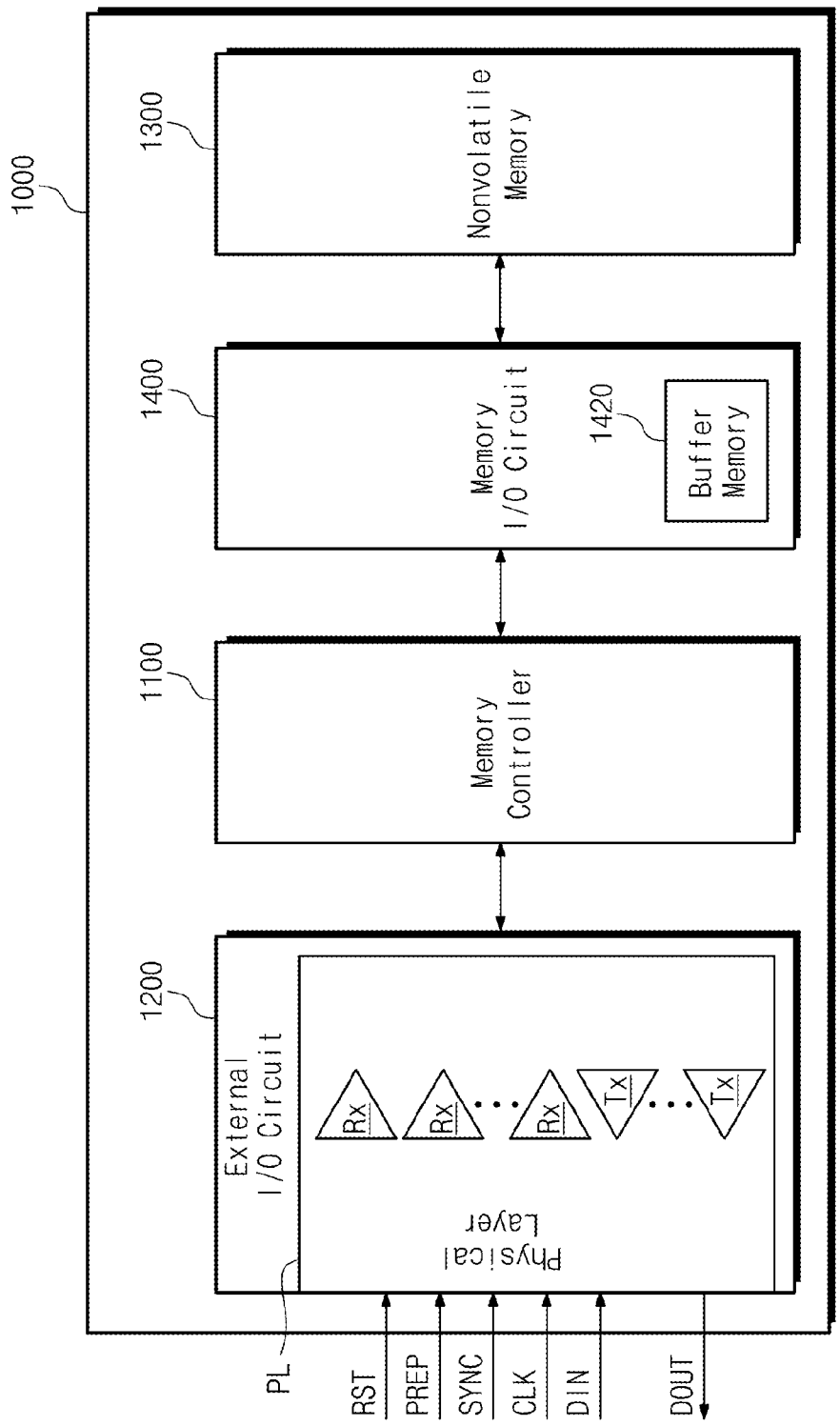
FIG. 13 is a block diagram illustrating an embedded storage according to an example embodiment.

FIG. 13 is a block diagram illustrating an embedded storage according to an example embodiment.

Referring to FIG. 13, an embedded storage 1000 according to an example embodiment may include a memory controller 1100, an external input/output circuit 1200, a nonvolatile memory 1300, and a memory input/output circuit 1400. However, the configuration of the embedded storage 1000 is an example to help understanding of inventive concepts, and not intended to be limiting. The embedded storage 1000 may further include other components not illustrated in FIG. 13. Alternatively, one or more components shown in FIG. 13 may be omitted from the embedded storage 1000.

The memory controller 1100 may manage and control overall operations of the embedded storage 1000. In particular, for example, the memory controller 1100 may process and manage data exchanged with a host through the external input/output circuit 1200.

The memory controller 1100 may control the embedded storage 1000 in response to a reset signal RST, a signal reception preparation command PREP, a synchronization command SYNC, and a clock signal CLK provided through the external input/output circuit 1200. The memory controller 1100 may store data DIN provided from the host through the external input/output circuit 1200 in the nonvolatile memory 1300 through the memory input/output circuit 1400. The memory controller 1100 may provide data DOUT stored in the nonvolatile memory 1300 to the host through the external input/output circuit 1200.

According to at least one example embodiment, the memory controller 1100 may control the embedded storage 1000 in compliance with the UFS interface protocol. However, inventive concepts are not limited thereto. For instance, the memory controller 1100 may control the embedded storage 1000 in compliance with one or more of various interface protocols, such as USB, SCSI, PCIe, M-PCIe, ATA, PATA, SATA, SAS, IDE, and so on.

The external input/output circuit 1200 according to an example embodiment may exchange signals and data with an external device or system. The external input/output circuit 1200 may include a physical layer PL. The external input/output circuit 1200 may operate in compliance with the interface protocol that uses the physical layer PL. In one example, the external input/output circuit 1200 may receive a differential signal from a host.

When the embedded storage 1000 is implemented in a mobile electronic system, the physical layer PL may be defined by the M-PHY specification. However, the inventive concepts are not limited thereto. The physical layer PL may include one or more transmitting circuits Tx and one or more receiving circuits Rx for exchanging data with the host. In particular, for example, each of the one or more receiving circuits included in the physical layer PL of the external input/output circuit 1200 may be implemented based on example embodiments.

More particularly, a receiving circuit Rx included in the physical layer PL of the external input/output circuit 1200 may include a configuration of a receiving circuit Rx shown in FIG. 3. In addition, the receiving circuit Rx included in the physical layer PL of the external input/output circuit 1200 may include a termination resistance circuit 220 and a resistance adjustment circuit 240 described above with reference to FIGS. 6 and 8. Further, the receiving circuit Rx included in the physical layer PL of the external input/output circuit 1200 may operate according to procedures and methods described above with reference to FIGS. 7, 9, 10, and 11. Redundant descriptions will be omitted below for brevity.

The nonvolatile memory 1300 is a memory that is configured to perform a function of the embedded storage 1000. The nonvolatile memory 1300 may store data regardless of whether power is supplied. The nonvolatile memory 1300 may store data corresponding to the differential signal received through the external input/output circuit 1200. For instance, the nonvolatile memory 1300 may be one of a NAND-type flash memory, a NOR-type flash memory, a phase-change random access memory (PRAM), a magneto-resistive RAM (MRAM), a resistive RAM (ReRAM), a ferro-electric RAM (FRAM), and so on. Alternatively, the nonvolatile memory 1300 may be implemented with different types of memories.

The nonvolatile memory 1300 may also be a two-dimensional (2D) or three dimensional (3D) memory array.

The memory input/output circuit 1400 may perform writing data in the nonvolatile memory 1300 and reading data from the nonvolatile memory 1300. For instance, the memory input/output circuit 1400 may include a buffer memory 1420 for buffering data temporarily. Although not shown in FIG. 13, the memory input/output circuit 1400 may further include other components for inputting and outputting data, such as an address decoder and a sense amplifier.

Figure 14:
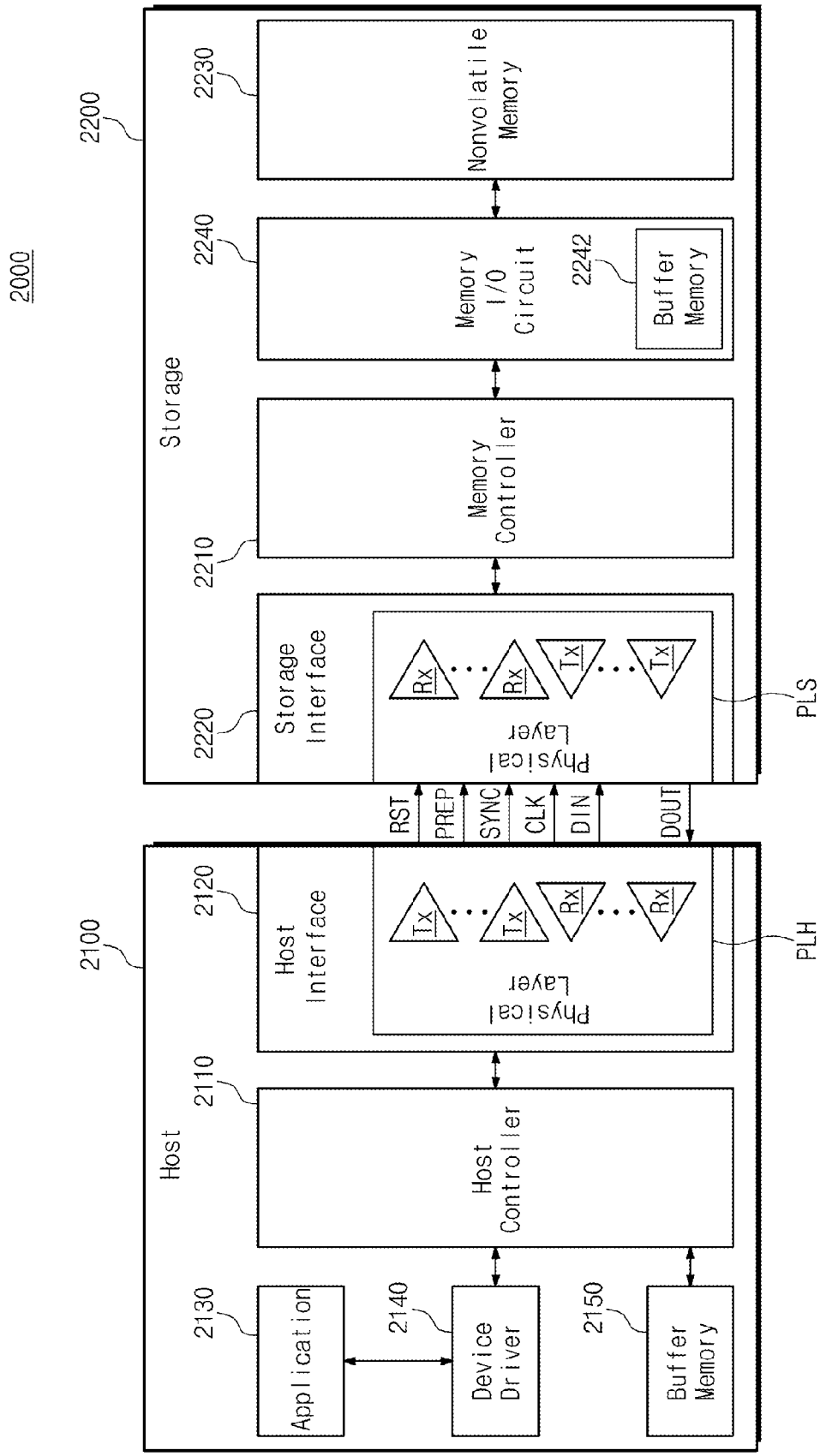
FIG. 14 is a block diagram illustrating a storage system including a card storage according to an example embodiment.

FIG. 14 is a block diagram illustrating a storage system including a card storage according to an example embodiment.

Referring to FIG. 14, a storage system 2000 may include a host 2100 and a card storage 2200.

The host 2100 may include a host controller 2110, a host interface 2120, an application 2130, a device driver 2140, and a buffer memory 2150. However, the configuration of the host 2100 is only an example to help understanding of inventive concepts. The host 2100 may further include other components not shown in FIG. 14, or one or more components shown in FIG. 14 may be omitted from the host 2100.

The host controller 2110 may manage and control overall operations of the host 2100. The host controller 2110 may process and manage data exchanged with the card storage 2200 through the host interface 2120. In one example, the host controller 2110 may control the host 2100 in compliance with the UFSHCI interface protocol. However, inventive concepts are not limited thereto.

The host interface 2120 according to an example embodiment may provide various kinds of commands (e.g., a signal reception preparation command PREP and a synchronization command SYNC) and signals (e.g., a reset signal RST and a clock signal CLK) to the card storage 2200. Further, the host interface 2120 may exchange data (e.g., input data DIN and output data DOUT) with the card storage 2200. The host interface 2120 may include a physical layer PLH. The host interface 2120 may communicate with the card storage 2200 in compliance with the interface protocol that uses the physical layer PLH. In at least one example embodiment, the host interface 2120 may transmit a differential signal to the card storage 2200.

In at least one example, when the storage system 2000 is implemented in a mobile electronic system, the physical layer PLH may be defined by the M-PHY specification. However, inventive concepts are not limited thereto. The physical layer PLH may include one or more transmitting circuits Tx and one or more receiving circuits Rx for exchanging data with the card storage 2200. In particular, each of the one or more receiving circuits included in the physical layer PL of the host interface 2120 may be implemented based on example embodiments.

More particularly, a receiving circuit Rx included in the physical layer PLH of the host interface 2120 may include a configuration of a receiving circuit Rx shown in FIG. 3. In addition, the receiving circuit included in the physical layer PLH of the host interface 2120 may include a termination resistance circuit 220 and a resistance adjustment circuit 240 described above with reference to FIGS. 6 and 8. Further, the receiving circuit included in the physical layer PLH of the host interface 2120 may operate according to procedures and methods described above with reference to FIGS. 7, 9, 10, and 11. Redundant descriptions will be omitted below for brevity.

The application 2130 may manage various kinds of application programs executed on the host 2100. The device driver 2140 may manage and drive peripheral devices connected with the host 2100. In FIG. 14, the device driver 2140 may drive the card storage 2200. The application 2130 and the device driver 2140 may be implemented in the form of program instruction (e.g., firmware).

The buffer memory 2150 may temporarily buffer data processed or to be processed by the host 2100. The buffer memory 2150 may include a nonvolatile memory, such as a flash memory, PRAM, MRAM, ReRAM, or FRAM, and/or a volatile memory, such as a static RAM (SRAM), dynamic RAM (DRAM), or synchronous DRAM (SDRAM).

The card storage 2200 may include a memory controller 2210, a storage interface 2220, a nonvolatile memory 2230, and a memory input/output circuit 2240. However, the configuration of the card storage 2200 is only an example to help understanding of inventive concepts, and not intended to be limiting. The card storage 2200 may further include other components not illustrated in FIG. 14, or one or more components shown in FIG. 14 may be omitted from the card storage 2200.

The memory controller 2210 may manage and control overall operations of the card storage 2200. The memory controller 2210 may process and manage data exchanged with the host 2100 through the storage interface 2220. In one example, the memory controller 2210 may control the card storage 2200 in compliance with the UFS interface protocol. However, inventive concepts are not limited thereto.

The memory controller 2210 may control the card storage 2200 in response to a reset signal RST, a signal reception preparation command PREP, a synchronization command SYNC, and a clock signal CLK provided through the storage interface 2220. The memory controller 2210 may store data DIN provided from the host 2100 through the storage interface 2220 in the nonvolatile memory 2230 through the memory input/output circuit 2240. Further, the memory controller 2210 may provide data DOUT stored in the nonvolatile memory 2230 to the host 2100 through the storage interface 2220.

The storage interface 2220 may receive various kinds of commands (e.g., a signal reception preparation command PREP and a synchronization command SYNC) and signals (e.g., a reset signal RST and a clock signal CLK) from the host 2100. Further, the storage interface 2220 may exchange data (e.g., input data DIN and output data DOUT) with the host 2100. The storage interface 2220 may include a physical layer PLS. The storage interface 2220 may operate according to the interface protocol that uses the physical layer PLS. In one example, the storage interface 2220 may receive the differential signal from the host 2100.

When the storage system 2000 is implemented in a mobile electronic system, the physical layer PLS may be defined by the M-PHY specification. However, inventive concepts are not limited thereto. The physical layer PLS may include one or more transmitting circuits Tx and one or more receiving circuits Rx for exchanging data with the host 2100. In particular, for example, each of the one or more receiving circuits included in the physical layer PLS of the storage interface 2220 may be implemented based on example embodiments.

More particularly, for example, a receiving circuit Rx included in the physical layer PLS of the storage interface 2220 may include a configuration of a receiving circuit Rx shown in FIG. 3. In addition, the receiving circuit Rx included in the physical layer PLS of the storage interface 2220 may include a termination resistance circuit 220 and a resistance adjustment circuit 240 described above with reference to FIGS. 6 and 8. Also, the receiving circuit Rx included in the physical layer PLS of the storage interface 2220 may operate according to procedures and methods described above with reference to FIGS. 7, 9, 10, and 11. Redundant descriptions will be omitted below for brevity.

The nonvolatile memory 2230 is a memory that is configured to perform a function of the card storage 2200. The nonvolatile memory 2230 may store data regardless of whether power is supplied. The nonvolatile memory 2230 may store data corresponding to the differential signal received through the storage interface 2220. The nonvolatile memory 2230 may be one of a NAND-type flash memory, a NOR-type flash memory, a PRAM, an MRAM, a ReRAM, an FRAM, and so on. Alternatively, the nonvolatile memory 2230 may be implemented with different types of memories.

The nonvolatile memory 2230 may also be a two-dimensional (2D) or three dimensional (3D) memory array.

The memory input/output circuit 2240 may perform writing data in the nonvolatile memory 2230 and reading data from the nonvolatile memory 2230. The memory input/output circuit 2240 may include a buffer memory 2242 for buffering data temporarily. The buffer memory 2242 may include a nonvolatile memory, such as a flash memory, PRAM, MRAM, ReRAM, or FRAM, and/or a volatile memory, such as a SRAM, DRAM, or SDRAM. Although not shown in FIG. 14, the memory input/output circuit 2240 may further include other components for inputting and outputting data, such as an address decoder and a sense amplifier.

An example configuration of a storage device that is implemented based on at least one example embodiment has been described with reference to FIGS. 13 and 14. However, as described above, inventive concepts may be applied to all interface circuits that use a physical layer. Inventive concepts should not be limited to only the storage device configurations shown in FIGS. 13 and 14.

Figure 15:
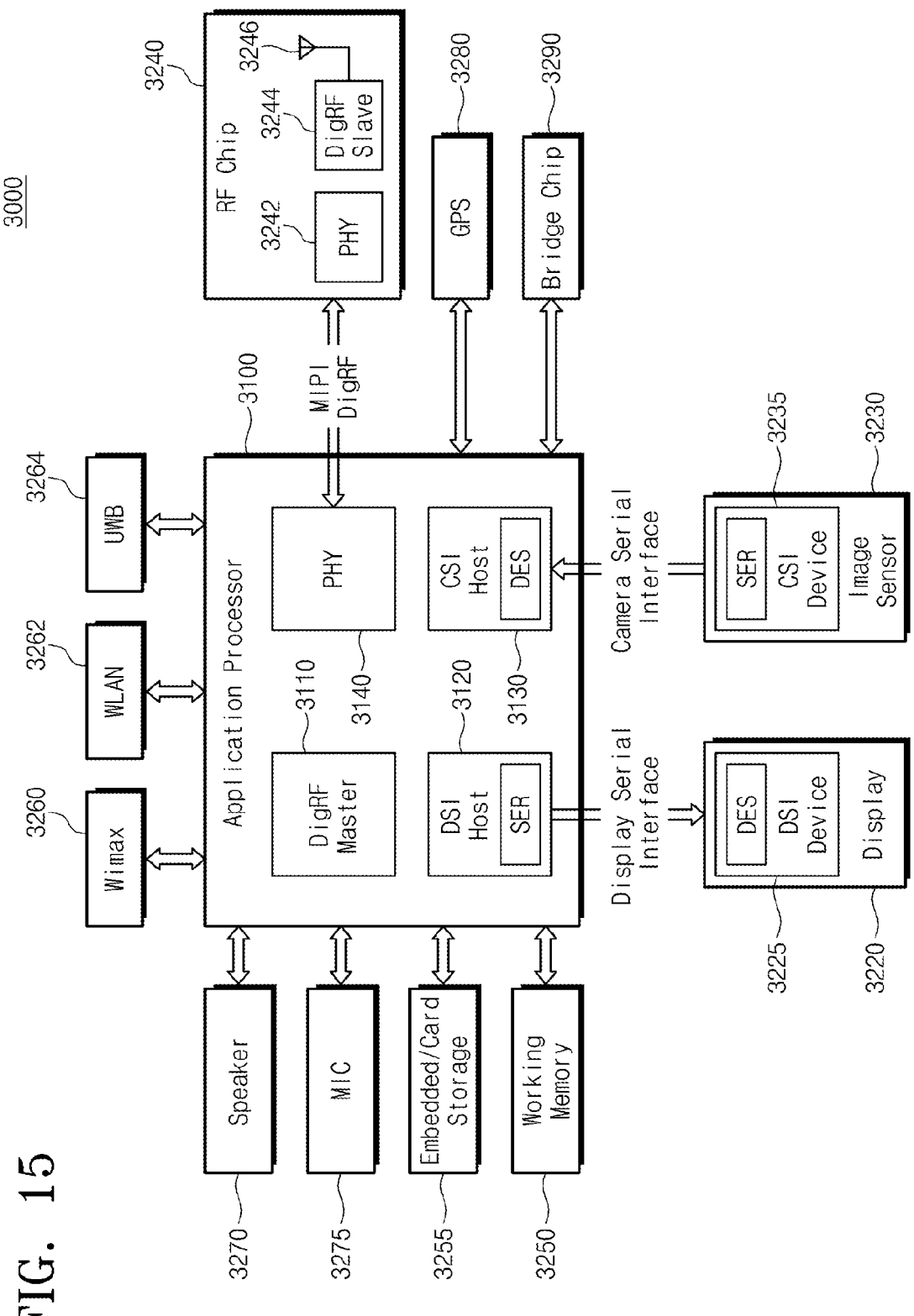
FIG. 15 is a block diagram illustrating an electronic system including a receiving circuit and interfaces according to example embodiments.

FIG. 15 is a block diagram illustrating an electronic system including a receiving circuit and interfaces according to example embodiments.

Referring to FIG. 15, an electronic system 3000 may be implemented with a data processing device (e.g., a cellular phone, personal digital assistant (PDA), portable media play (PMP), smart phone, wearable device, etc.) using or supporting the interface proposed by the MIPI alliance.

The electronic system 3000 may include an application processor 3100, a display 3220, and an image sensor 3230. The application processor 3100 may include a DigRF master 3110, a display serial interface (DSI) host 3120, a camera serial interface (CSI) host 3130, and a physical layer 3140.

The DSI host 3120 may communicate with a DSI device 3225 of the display 3220 according to the DSI. In one example, an optical serializer SER may be implemented in the DSI host 3120, and an optical de-serializer DES may be implemented in the DSI device 3225.

The CSI host 3130 may communicate with a CSI device 3235 of the image sensor 3230 according to the CSI. An optical de-serializer DES may be implemented in the CSI host 3130, and an optical serializer SER may be implemented in the CSI device 3235.

The DSI and the CSI may use a physical layer. The DSI and the CSI may adopt one or more example embodiments described herein. For instance, a receiving circuit included in the physical layer of each of the DSI host 3120 and the DSI device 3225 may include a termination resistance of which a resistance value is adjusted according to one or more example embodiments. In addition, a receiving circuit included in the physical layer of each of the CSI device 3225 and the CSI host 3130 may include a termination resistance of which a resistance value is adjusted according to one or more example embodiments.

The electronic device 3000 may further include a radio frequency (RF) chip 3240 capable of communicating with the application processor 3100. The RF chip 3240 may include a physical layer 3242, a DigRF slave 3244, and an antenna 3246. For instance, the physical layer 3242 of the RF chip 3240 and the physical layer 3140 of the application processor 3100 may exchange data through the DigRF interface proposed by the MIPI alliance. The DigRF interface may adopt one or more example embodiments described herein. For instance, a receiving circuit included in each of the physical layers 3140 and 3242 may include a termination resistance of which a resistance value is adjusted according to one or more example embodiments.

The electronic system 3000 may further include a working memory 3250 and an embedded/card storage 3255. The working memory 3250 and the embedded/card storage 3255 may store data provided from the application processor 3100. Further, the working memory 3250 and the embedded/card storage 3255 provide data stored therein to the application processor 3100.

The working memory 3250 may temporarily store data processed or to be processed by the application processor 3100. The working memory 3250 may include a nonvolatile memory, such as a flash memory, PRAM, MRAM, ReRAM, or FRAM, and/or a volatile memory, such as a SRAM, DRAM, or SDRAM.

The embedded/card storage 3255 may store data regardless of whether power is supplied. In one example, the embedded/card storage 3255 may operate in compliance with the UFS interface protocol. However, inventive concepts are not limited thereto. As described with reference to FIGS. 13 and 14, a receiving circuit included in a physical layer of the embedded/card storage 3255 may include a termination resistance of which a resistance value is adjusted according to one or more example embodiments described herein.

The embedded/card storage 3255 may include a nonvolatile memory, which may also be a two-dimensional (2D) or three dimensional (3D) memory array.

The electronic system 3000 may communicate with an external system (not shown) via world interoperability for microwave access (WiMax) 3260, wireless local area network (WLAN) 3262, and ultra wideband (UWB) 3264. In one example, a receiving circuit included in a physical layer of the WLAN 3262 may include a termination resistance of which a resistance value is adjusted according to one or more example embodiments discussed herein.

The electronic system 3000 may further include a speaker 3270 and a microphone 3275 to process voice information. The electronic system 3000 may further include a global positioning system (GPS) device 3280 for processing position information.

The electronic system 3000 may further include a bridge chip 3290 for managing connections with peripheral devices. In one example, a receiving circuit included in a physical layer of the bridge chip 3290 may include a termination resistance of which a resistance value is adjusted according to one or more example embodiments discussed herein.

Configurations illustrated in each conceptual diagram should be understood from a conceptual point of view. Shape, structure, and size of each component shown in a conceptual diagram are exaggerated or downsized to help understanding of the present invention. Actually implemented configurations may be different from those of each conceptual diagram. Each conceptual diagram is not intended to limit the physical shape of the component.

Device configurations shown in each block diagram are intended to help understanding of inventive concepts. Each block may be formed of smaller blocks according to a function. Alternatively, a plurality of blocks may form a larger unit of block according to functions. However, inventive concepts are not limited to components shown in each block diagram.

While inventive concepts have been described with reference to example embodiments, it will be apparent to those skilled in the art that various changes and/or modifications may be made without departing from the spirit and scope of inventive concepts. Therefore, it should be understood that the above-mentioned example embodiments are not limiting, but illustrative.

What is claimed is:

1. A receiving circuit configured to receive a differential signal, the receiving circuit comprising:
    a termination resistance circuit connected between a first input terminal and a second input terminal, the termination resistance circuit having a resistance value that is adjustable between a first resistance value and a second resistance value, the second resistance value being less than the first resistance value;
    a switching circuit configured to control a connection between the termination resistance circuit and each of the first and second input terminals; and
    a resistance adjustment circuit configured to adjust the resistance value of the termination resistance circuit from the first resistance value to the second resistance value when the termination resistance circuit is disconnected from at least one of the first and second input terminals, and then connected to the first and second input terminals by the switching circuit; wherein
    the switching circuit is further configured to connect the termination resistance circuit to the first and second input terminals in response to a signal reception preparation command.

2. The receiving circuit of claim 1, further comprising:
    the first and second input terminals configured to transmit the received differential signal.

3. The receiving circuit of claim 1, wherein switching circuit is further configured to receive the signal reception preparation command from a transmitting circuit.

4. The receiving circuit of claim 1, wherein the resistance adjustment circuit is further configured to adjust the resistance value of the termination resistance circuit from the first resistance value to the second resistance value in response to the signal reception preparation command.

5. The receiving circuit of claim 1, wherein
    the termination resistance circuit includes a plurality of resistive elements; and
    the resistance value of the termination resistance circuit corresponds to a number of resistive elements, from among the plurality of resistive elements, connected to the first and second input terminals.

6. The receiving circuit of claim 5, wherein the resistance adjustment circuit is further configured to adjust the number of the resistive elements connected to the first and second input terminals to stepwise decrease the resistance value of the termination resistance circuit from the first resistance value to the second resistance value.

7. The receiving circuit of claim 1, wherein
the termination resistance circuit includes one or more variable resistive elements; and
the resistance value of the termination resistance circuit is adjusted according to resistance values of the one or more variable resistive elements.

8. The receiving circuit of claim 7, wherein the resistance adjustment circuit is further configured to adjust a resistance value of at least one of the one or more variable resistive elements to decrease the resistance value of the termination resistance circuit from the first resistance value to the second resistance value.

9. The receiving circuit of claim 1, wherein when the resistance value of the termination resistance circuit is set to the second resistance value, the resistance value of the termination resistance circuit is maintained at the second resistance value until the termination resistance circuit is disconnected from at least one of the first and second input terminals.

10. The receiving circuit of claim 1, wherein the differential signal is received after the resistance value of the termination resistance circuit is set to the second resistance value.

11. The receiving circuit of claim 10, wherein when transmission of the received differential signal ends or stops, the switching circuit is further configured to disconnect the termination resistance circuit from at least one of the first and second input terminals.

12. The receiving circuit of claim 1, wherein the first and second input terminals, the termination resistance circuit, the switching circuit, and the resistance adjustment circuit are part of a physical layer of the receiving circuit, the physical layer being defined based on a mobile industry processor interface (MIPI) M-PHY specification.

13. A method of operating a receiving circuit, the method comprising:
receiving a signal reception preparation command through first and second input terminals;
connecting a termination resistance circuit between the first input terminal and the second input terminal in response to receiving the signal reception preparation command;
adjusting a resistance value of the termination resistance circuit from a first resistance value to a second resistance value in response to connecting the termination resistance circuit between the first and second input terminals, the second resistance value being less than the first resistance value; and
receiving a differential signal through the first and second input terminals when the resistance value of the termination resistance circuit is set to the second resistance value and a signal reception preparation state initiated in response to the signal reception preparation command ends.

14. The method of claim 13, wherein the adjusting comprises:
decreasing the resistance value of the termination resistance circuit from the first resistance value to the second resistance value.

15. The method of claim 14, wherein the decreasing comprises:
stepwise decreasing the resistance value of the termination resistance circuit from the first resistance value to the second resistance value.

16. The method of claim 13, further comprising:
maintaining the resistance value of the termination resistance circuit at the second resistance value while the termination resistance circuit is connected to the first and second input terminals.

17. The operating method of claim 13, further comprising:
disconnecting the termination resistance circuit from at least one of the first and second input terminals after receipt of the differential signal.

18. A storage device comprising:
a memory controller;
an interface circuit configured to receive a differential signal from a host in accordance with an interface protocol using a physical layer; and
a nonvolatile memory configured to store data corresponding to the received differential signal according to a control of the memory controller,
wherein the interface circuit includes one or more receiving circuits at the physical layer, at least one of the one or more receiving circuits including
a termination resistance circuit connected between a first input terminal and a second input terminal, the termination resistance circuit having a resistance value that is adjustable between a first resistance value and a second resistance value, the second resistance value being less than the first resistance value;
a switching circuit configured to control a connection between the termination resistance circuit and each of the first and second input terminals; and
a resistance adjustment circuit configured to adjust the resistance value of the termination resistance circuit from the first resistance value to the second resistance value when the termination resistance circuit is disconnected from at least one of the first and second input terminals, and then connected to the first and second input terminals by the switching circuit; wherein
the switching circuit is further configured to connect the termination resistance circuit to the first and second input terminals in response to a signal reception preparation command.

19. The storage device of claim 18, wherein
the physical layer is defined based on a mobile industry processor interface (MIPI) M-PHY specification;
the memory controller is configured to exchange data with the nonvolatile memory in compliance with a universal flash storage (UFS) interface protocol; and
the memory controller, the interface circuit, and the nonvolatile memory are implemented in one of (i) an embedded storage configured to be embedded in a mobile electronic system, and (ii) a card storage configured to be connected to the mobile electronic system.

* * * * *